(12) United States Patent
Yao et al.

(10) Patent No.: US 12,543,319 B2
(45) Date of Patent: Feb. 3, 2026

(54) SEMICONDUCTOR DEVICE INCLUDING REDUCED-SIZE TRANSISTORS, MANUFACTURING METHOD THEREOF, AND NAND MEMORY DEVICE

(71) Applicant: YANGTZE MEMORY TECHNOLOGIES CO., LTD., Wuhan (CN)

(72) Inventors: Lan Yao, Wuhan (CN); Ziqun Hua, Wuhan (CN); Yanwei Shi, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 819 days.

(21) Appl. No.: 17/877,708

(22) Filed: Jul. 29, 2022

(65) Prior Publication Data
US 2023/0061535 A1 Mar. 2, 2023

Related U.S. Application Data

(63) Continuation of application No. PCT/CN2021/115852, filed on Aug. 31, 2021.

(51) Int. Cl.
*H10B 43/40* (2023.01)
*H10B 41/27* (2023.01)
*H10B 41/41* (2023.01)
*H10B 43/27* (2023.01)

(52) U.S. Cl.
CPC ............ *H10B 43/40* (2023.02); *H10B 41/27* (2023.02); *H10B 41/41* (2023.02); *H10B 43/27* (2023.02)

(58) Field of Classification Search
CPC ........ H10B 43/40; H10B 41/27; H10B 41/41; H10B 43/27; H10B 43/50; H10B 69/00; H10D 30/027; H10D 30/637; H10D 64/025
See application file for complete search history.

(56) References Cited

U.S. PATENT DOCUMENTS

| | | | |
|---|---|---|---|
| 2002/0003256 A1 | 1/2002 | Maegawa | |
| 2005/0215016 A1* | 9/2005 | Yang | H10D 30/024 |
| | | | 438/296 |
| 2017/0345833 A1* | 11/2017 | Yao | H10B 41/30 |
| 2019/0326318 A1* | 10/2019 | Jung | H10B 43/10 |
| 2021/0082705 A1* | 3/2021 | Tsai | H10D 64/519 |
| 2023/0078865 A1* | 3/2023 | Chen | H01L 24/50 |

FOREIGN PATENT DOCUMENTS

| | | | | |
|---|---|---|---|---|
| CN | 110391245 A | | 10/2019 | |
| CN | 110854196 A | | 2/2020 | |
| CN | 112071909 A | * | 12/2020 | ........... H10D 30/021 |
| CN | 113257739 A | | 8/2021 | |
| KR | 100596807 B1 | * | 7/2006 | ....... H01L 21/28044 |

* cited by examiner

Primary Examiner — Ratisha Mehta
Assistant Examiner — Sophia W Kao
(74) Attorney, Agent, or Firm — BAYES LLC

(57) ABSTRACT

A semiconductor device, a manufacturing method thereof and a NAND memory device are disclosed. The method comprises forming a substrate including an active region and an isolation region located around the active region. The active region includes a source region, a channel region, and a drain region. The method further comprises forming a groove between the isolation region and the channel region and partially above the isolation region, and forming a gate in the groove and on the channel region.

20 Claims, 20 Drawing Sheets

SEMICONDUCTOR DEVICE INCLUDING REDUCED-SIZE TRANSISTORS, MANUFACTURING METHOD THEREOF, AND NAND MEMORY DEVICE

CROSS-REFERENCE TO RELATED APPLICATIONS

This application is a continuation of International Application No. PCT/CN2021/115852, filed on Aug. 31, 2021, which is hereby incorporated by reference in its entirety.

TECHNICAL FIELD

This application relates to the technical field of semiconductor devices, in particular to a semiconductor device and a manufacturing method thereof, and a NAND memory device.

BACKGROUND

With the development of technology, the semiconductor industry is constantly looking for new production ways to pursue larger number of memory cells in each memory die in a memory device. Thereinto, a 3D NAND (three-dimensional NAND gate) memory device has become a relatively cutting-edge memory technology with great development potential due to its advantages such as high storage density and low cost.

At present, in order to increase the storage density and capacity of a 3D NAND memory device, a higher storage capacity in a smaller space is generally achieved by a way of vertically stacking multi-layer memory cells. However, with the increase in the number of stacked layers in a 3D NAND memory device, the CMOS (Complementary Metal-Oxide Semiconductor) process requirements are getting higher and higher, especially in terms of size reduction.

Therefore, how to improve the performance of a transistor device and decrease the difficulty of the manufacturing process of the transistor device while reducing the size of the transistor device is a problem that needs to be solved urgently.

SUMMARY

This application provides a semiconductor device, a manufacturing method thereof, and a NAND memory device to solve the problem of how to improve the performance of the transistor device and decrease the difficulty of the manufacturing process of the transistor device while reducing the size of the transistor device.

In order to solve the above-mentioned problems, the present application provides a manufacturing method of a semiconductor device including: forming a substrate, wherein the substrate includes a first active region and an isolation region located around the first active region, and the first active region includes a first source region, a first channel region and a first drain region that are sequentially connected; forming a patterned first hard mask layer on the substrate, wherein the patterned first hard mask layer includes a first opening, and the first opening is used to expose the first channel region and a part of the isolation region; forming a first groove between the isolation region and the first channel region through the first opening, wherein the first groove is partially located in the isolation region and does not penetrate through the isolation region; forming a first gate insulating layer covering the first groove and the first channel region; forming a first gate in the first opening and the first groove on the first gate insulating layer; and removing the patterned first hard mask layer.

Thereinto, forming a first gate in the first opening and the first groove on the first gate insulating layer includes: depositing a gate material in the first opening and the first groove on the first gate insulating layer; and removing the gate material located outside the first opening by chemical mechanical polishing, to obtain the first gate.

Thereinto, the substrate further includes a shallow trench formed in the isolation region and located around the first active region, and the manufacturing method further includes, before forming the patterned first hard mask layer on the substrate, forming a shallow trench isolation structure in the shallow trench of the isolation region, and the forming a first groove between the isolation region and the first channel region through the first opening includes: forming a first groove between the shallow trench isolation structure and the first channel region through the first opening, wherein a depth of the first groove in a longitudinal direction perpendicular to the substrate is smaller than a depth of the shallow trench isolation structure in the longitudinal direction.

Thereinto, the forming a first groove between the shallow trench isolation structure and the first channel region through the first opening includes: forming a patterned second hard mask layer on the patterned first hard mask layer, wherein the patterned second hard mask layer includes a second opening, the second opening is communicated with the first opening, and a part of the shallow trench isolation structure is exposed through the first opening and the second opening; and selectively removing the part of the shallow trench isolation structure exposed by the first opening and the second opening to obtain a first groove located between the shallow trench isolation structure and the first channel region, and wherein the patterned second hard mask layer is used, in the course of selectively removing the part of the shallow trench isolation structure exposed by the first opening and the second opening, to protect the shallow trench isolation structure remained from being removed.

Thereinto, the substrate further includes a second active region, the first active region and the second active region are spaced apart by the isolation region and the second active region includes a second source region, a second channel region and a second drain region that are sequentially connected, the patterned first hard mask layer further includes a third opening, the third opening is used to expose the second channel region and a part of the isolation region, and before forming a first gate in the first opening and the first groove on the first gate insulating layer, the manufacturing method further includes: forming a second groove between the isolation region and the second channel region through the third opening, wherein the second groove is partially located in the isolation region and does not penetrate through the isolation region; and forming a second gate insulating layer covering the second groove and the second channel region, wherein a thickness of the second gate insulating layer is different from a thickness of the first gate insulating layer.

Thereinto, after forming a second gate insulating layer covering the second groove and the second channel region, the manufacturing method further includes: forming a second gate in the third opening and the second groove on the second gate insulating layer.

Thereinto, a depth of the second groove in a longitudinal direction perpendicular to the substrate is smaller than a depth of the first groove in the longitudinal direction.

Thereinto, after removing the patterned first hard mask layer, the manufacturing method further includes: forming a sidewall on a side surface of the first gate.

In order to solve the above-mentioned problems, the present application further provides a semiconductor device including: a substrate including a first active region and an isolation region located around the first active region, wherein the first active region includes a first source region, a first channel region and a first drain region that are sequentially connected; a first groove located between the isolation region and the first channel region, wherein the first groove is partially located in the isolation region and does not penetrate through the isolation region; a first gate insulating layer covering the first groove and the first channel region; and a first gate located on the first gate insulating layer, wherein the first gate covers the first channel region and fills the first groove.

Thereinto, the substrate further includes a second active region, the first active region and the second active region are spaced apart by the isolation region, and the second active region includes a second source region, a second channel region and a second drain region that are sequentially connected, and the semiconductor device further includes: a second groove located between the isolation region and the second channel region, wherein the second groove is partially located in the isolation region and does not penetrate through the isolation region; and a second gate insulating layer covering the second groove and the second channel region, wherein a thickness of the second gate insulating layer is different from a thickness of the first gate insulating layer.

Thereinto, the semiconductor device further includes a second gate which covers the second channel region and fills the second groove.

Thereinto, a depth of the second groove in a longitudinal direction perpendicular to the substrate is smaller than a depth of the first groove in the longitudinal direction.

In order to solve the above-mentioned problems, the present application further provides a NAND memory device including a memory array and a peripheral device that are electrically connected, the memory array including a plurality of memory cell strings, and the peripheral device including: a substrate including a first active region and an isolation region located around the first active region, wherein the first active region includes a first source region, a first channel region and a first drain region that are sequentially connected; a first groove located between the isolation region and the first channel region, wherein the first groove is partially located in the isolation region and does not penetrate through the isolation region; a first gate insulating layer covering the first groove and the first channel region; and a first gate located on the first gate insulating layer, wherein the first gate covers the first channel region and fills the first groove.

Thereinto, the substrate further includes a second active region, the first active region and the second active region are spaced apart by the isolation region, and the second active region includes a second source region, a second channel region and a second drain region that are sequentially connected, and the peripheral device further includes: a second groove located between the isolation region and the second channel region, wherein the second groove is partially located in the isolation region and does not penetrate through the isolation region; and a second gate insulating layer covering the second groove and the second channel region, wherein a thickness of the second gate insulating layer is different from a thickness of the first gate insulating layer.

Thereinto, the peripheral device further includes a second gate which covers the second channel region and fills the second groove.

Thereinto, a depth of the second groove in a longitudinal direction perpendicular to the substrate is smaller than a depth of the first groove in the longitudinal direction.

Thereinto, the memory array further includes: a stacked structure located on the peripheral device, wherein each of the memory cell strings includes a channel layer and a storage functional layer penetrating through the stacked structure, and the storage functional layer is located between the channel layer and the stacked structure.

Thereinto, the memory array further includes: an interconnection layer disposed on a side of the stacked structure facing the peripheral device, wherein the memory cell strings are electrically connected with the interconnection layer, and the interconnection layer is electrically connected to the substrate in the first source region, the substrate in the first drain region and/or the first gate.

The beneficial effect of the present application is that, the semiconductor device and the manufacturing method thereof, and the NAND memory device provided by the present application can increase the effective length of the gate to improve the control of the gate to the transistor channel, thereby while reducing the transistor device size, being capable of improving electrical characteristic parameters of the transistor such as the saturation current, the leakage current and the like, improving the performance of the transistor device, and there is no need to etch the gate material layer to form the gate, avoiding the problem of the increase in the process difficulty of forming the gate by etching the gate material layer due to the reducing of the transistor device size, which in turn leads to the increase of production costs, and reducing production costs.

BRIEF DESCRIPTION OF THE DRAWINGS

In order to more clearly describe the technical solutions in the embodiments of the present application, the accompanying drawings needed in the description of the embodiments will be briefly introduced in the following. Obviously, the accompanying drawings described in the following are only some embodiments of the present application. For those skilled in the art, without creative work, other accompanying drawings can be obtained based on these accompanying drawings.

DETAILED DESCRIPTION

Figure 1:
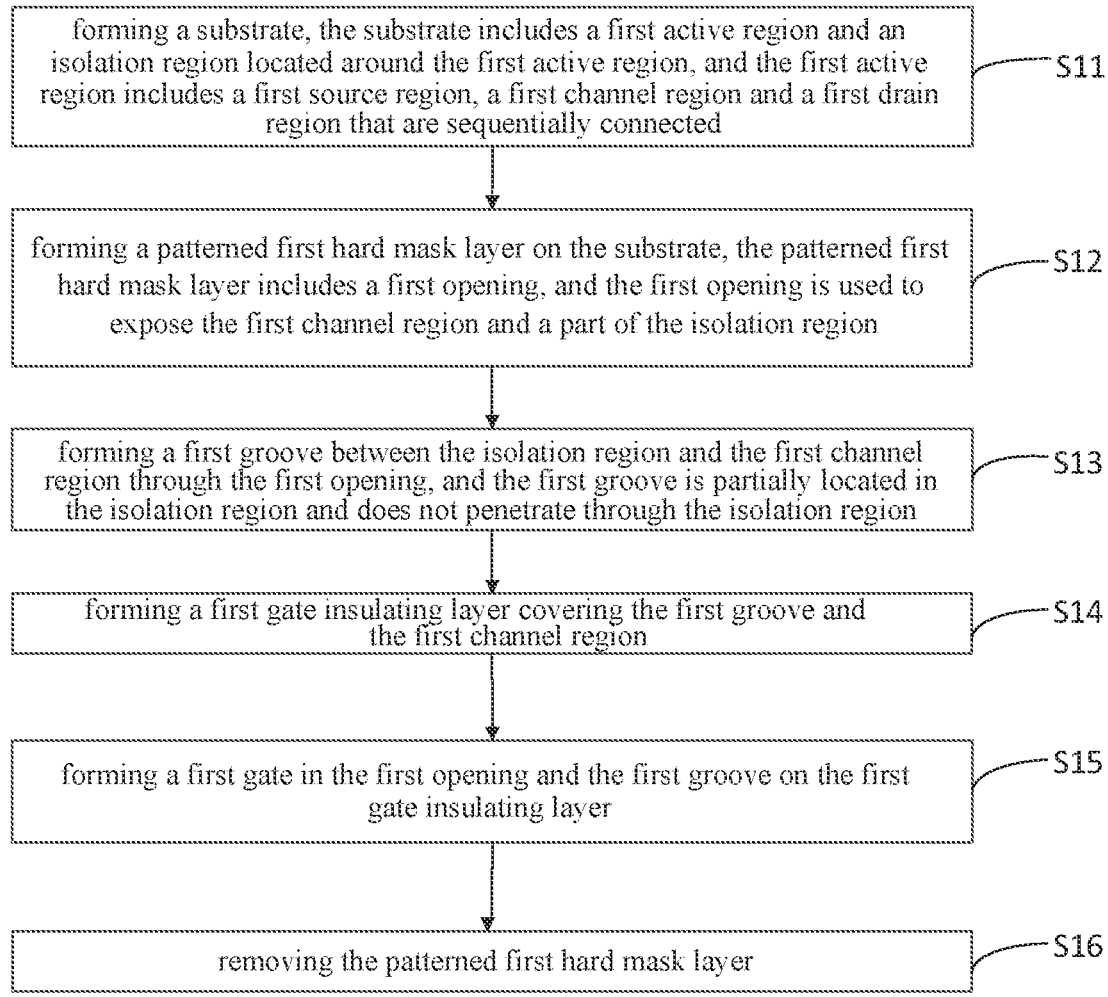
FIG. 1 is a schematic of flow of a manufacturing method of a semiconductor device provided by an embodiment of the present application.

The application will be further described in detail below in conjunction with the accompanying drawings and embodiments. It is particularly pointed out that the following examples are only used to illustrate the application, but not limiting the scope of the application. Similarly, the following embodiments are only part of the embodiments of the present application, but not all of the embodiments, and all other embodiments obtained by a person of ordinary skill in the art without creative work shall fall within the protection scope of the present application.

In addition, the directional terms mentioned in this application, such as "upper", "lower", "front", "back", "left", "right", "inside", "outside", "side", etc., only refer to the directions of the accompanying drawings. Therefore, the directional terms used are used to illustrate and demonstrate the application, rather than to limit the application. In the various accompanying drawings, units with similar structures are denoted by the same reference numerals. For the sake of clarity, the various parts in the accompanying drawings are not drawn to scale. In addition, some well-known parts may not be shown in the accompanying drawings.

This application can be presented in various forms, some examples of which will be described below.

Referring to FIG. 1, a schematic of flow of a manufacturing method of a semiconductor device is provided according to an embodiment of the present application. The specific flow of the manufacturing method of the semiconductor device may be as follows:

Step S11: A substrate is formed, which includes a first active region and an isolation region located around the first active region. The first active region includes a first source region, a first channel region and a first drain region that are sequentially connected.

In this embodiment, the above-mentioned semiconductor device may be a semiconductor device having at least one transistor, wherein the transistor may be a Metal Oxide Semiconductor Field-Effect Transistor (MOSFET). The number of the above-mentioned first active regions may be one or more, and each first active region may correspond to the active region of one transistor in the above-mentioned semiconductor device. Correspondingly, in each first active region, the substrate in the first source region, the substrate in the first channel region and the substrate in the first drain region may respectively correspond to the source, channel and drain of one transistor in the above-mentioned semiconductor device.

Figure 2:
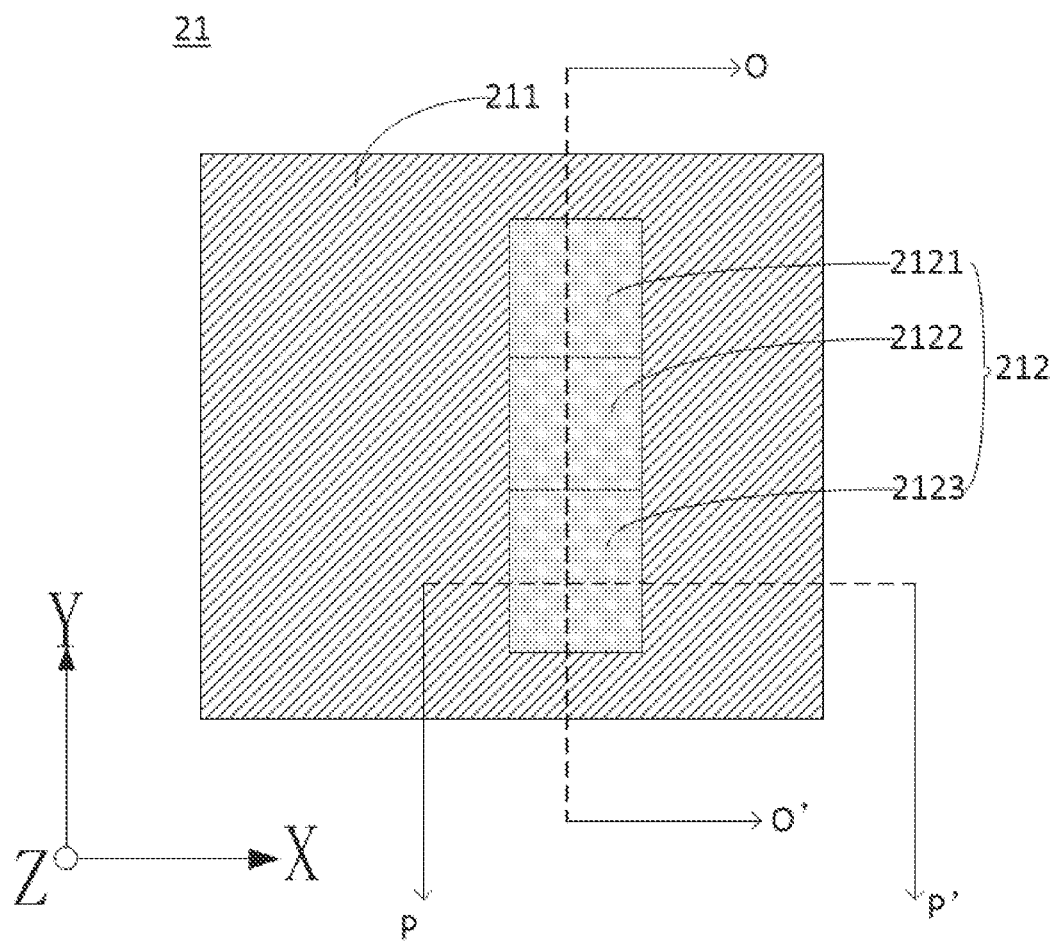
FIG. 2 is a schematic of top view structure of a substrate provided by an embodiment of the present application.
Figure 3:
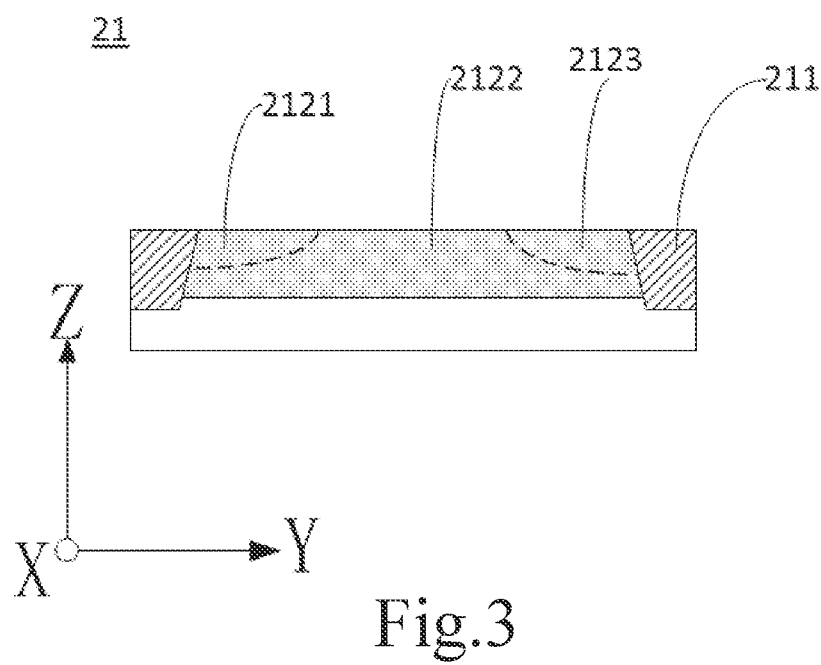
FIG. 3 is a schematic of cross-sectional structure taken along the line O-O' in FIG. 2.
Figure 4:
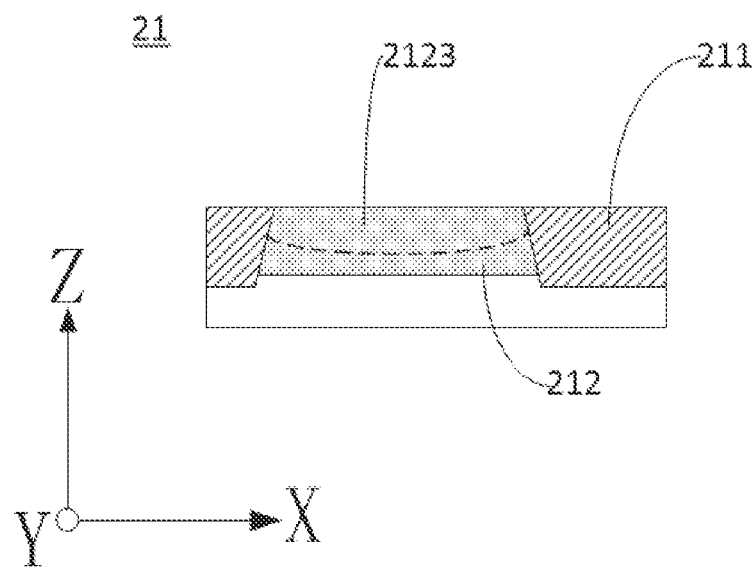
FIG. 4 is a schematic of cross-sectional structure taken along the line P-P' in FIG. 2.

As shown in FIG. 2, FIG. 3 and FIG. 4, the above-mentioned first active region 212 may be located at the top of the substrate 21, and in the first active region 212, the above-mentioned first source region 2121 and the above-mentioned first drain region 2123 may be located respectively at two opposite ends of the first active region 212 (for example, the two top opposite ends), and the corresponding above-mentioned first channel region 2122 may be a region located in the first active region 212 between the first source region 2121 and the first drain region 2123.

In addition, during specific implementing, the initial active region of the initial substrate may be P-type doped to form the intermediate active region, and then the two opposite ends of the intermediate active region may be N-type doped to form the above-mentioned first active region 212. In other embodiments, the initial active region of the initial substrate may also be N-type doped to form the intermediate active region, and then the two opposite ends of the intermediate active region may be P-type doped to form the above-mentioned first active region 212. Thereinto, the above-mentioned initial substrate is the substrate 21 before the first active region 212 is formed, and the initial substrate may be a semiconductor substrate, for example, a silicon (Si) substrate, a germanium (Ge) substrate, or a SiGe substrate, a Silicon On Insulator (SOI) substrate or a Germanium On Insulator (GOI) substrate, etc.

In this embodiment, as shown in FIG. 2, FIG. 3 and FIG. 4, the above-mentioned isolation region 211 is used to electrically isolate the first active region 212 from other structures located around the first active region 212 (for example, other active regions) so as to facilitate subsequent independent control of the transistor formed based on the first active region 212. Moreover, when there are a plurality of the above-mentioned first active regions 212, the plurality of first active regions 212 may be disposed at intervals and spaced apart by the above-mentioned isolation region 211 to ensure the electrical isolation between the active regions of different transistors in the above-mentioned semiconductor device.

The above-mentioned isolation region 211 and the above-mentioned first active region 212 may both be located at the top of the above-mentioned substrate 21, and the depth of the above-mentioned isolation region 211 in the longitudinal direction Z perpendicular to the substrate 21 is not smaller than that of the above-mentioned first active region 212 in the longitudinal direction Z. In some embodiments, as shown in FIG. 3 and FIG. 4, the cross-sectional width of the above-mentioned first active region 212 may gradually increase from top to bottom. The cross-sectional shape of the first active region 212 may be regular trapezoid.

Step S12: A patterned first hard mask layer is formed on the substrate, the patterned first hard mask layer includes a first opening, and the first opening is used to expose the first channel region and a part of the isolation region.

Thereinto, the above-mentioned step S12 may include:

Step S1221: A first hard mask layer and a photoresist layer are sequentially formed on the substrate.

Step S1222: Exposure and development are performed to pattern the photoresist layer.

Step S1223: The first hard mask layer is etched according to the patterned photoresist layer to obtain a patterned hard mask layer.

Figure 5:
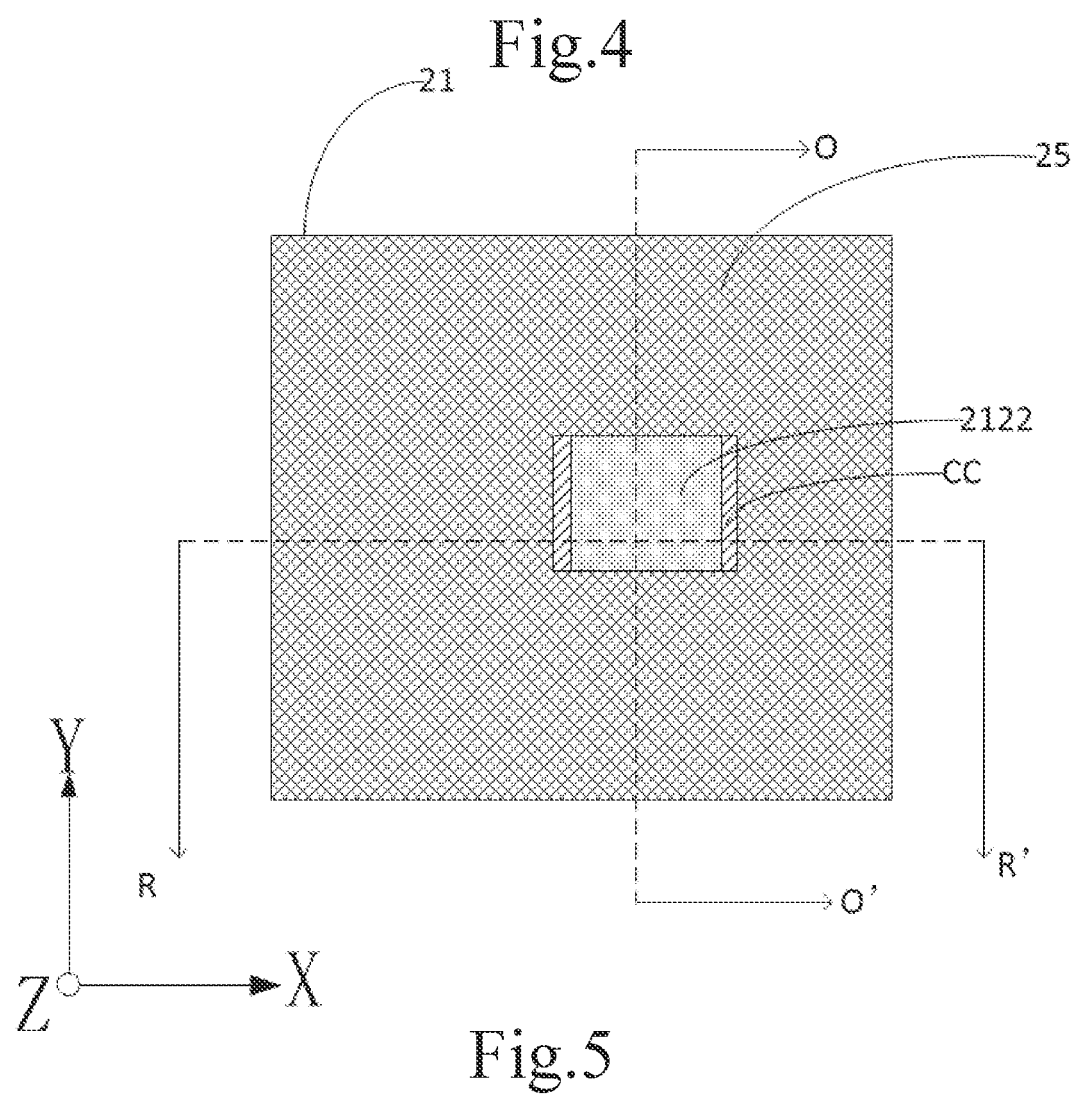
FIG. 5 is a schematic of top view structure after the completion of step S1223 provided by an embodiment of the present application.
Figure 6:
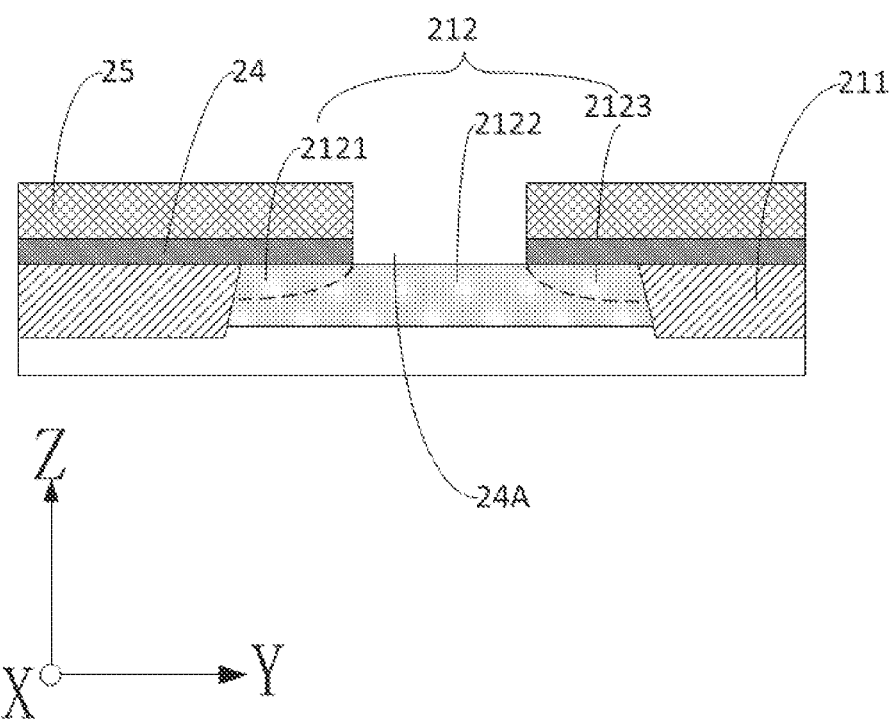
FIG. 6 is a schematic of cross-sectional structure taken along the line O-O' in FIG. 5.
Figure 7:
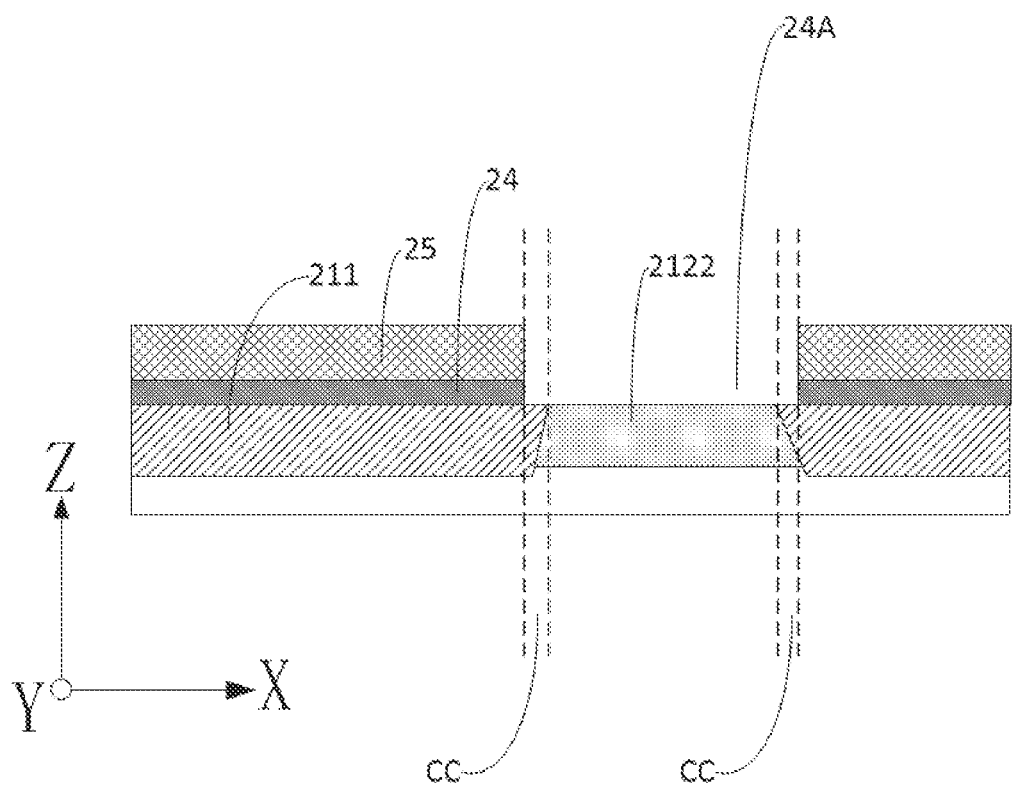
FIG. 7 is a schematic of cross-sectional structure taken along the line R-R' in FIG. 5.

Thereinto, the schematics of structure after the step S1223 being completed are shown in FIG. 5, FIG. 6 and FIG. 7.

The first opening 24A opened on the above-mentioned patterned first hard mask layer 24 is used to define the gate formation position of at least part of the transistors in the above-mentioned semiconductor device. When a plurality of transistors are integrated in the above-mentioned semiconductor device, there also exist a plurality of the above-mentioned first openings 24A, and the plurality of first openings 24A can correspond to the plurality of transistors in the above-mentioned semiconductor device one-to-one, that is, each first opening 24A is used to define the gate formation position of its corresponding one transistor in the above-mentioned semiconductor device. Thereinto, the material of the above-mentioned first hard mask layer 24 may be, but is not limited to, silicon nitride, and the shape of the above-mentioned first opening 24A may be a shape such as a rectangular or "H" shape and the like.

It will be appreciated that the above-mentioned first opening 24A may be used for exposing a part of the first channel region 2122 of the above-mentioned first active region 212, or for exposing the entire first channel region 2122 of the above-mentioned first active region 212. In the same way, the above-mentioned first opening 24A can be used to expose the entire interface region CC where the above-mentioned first channel region 2122 is connected with the above-mentioned isolation region 211, or to expose a part of the interface region CC where the above-mentioned first channel region 2122 is connected with the above-mentioned isolation region 211. For example, the above-mentioned first opening 24A may expose a part of the first channel region 2122 of the above-mentioned first active region 212 and the entire interface region CC where the first channel region 2122 of the above-mentioned first active region 212 is connected with the above-mentioned isolation region 211. Moreover, after the first hard mask layer 24 is etched, the remaining photoresist layer 25 on the first hard mask layer 24 can be removed to obtain the above-mentioned patterned first hard mask layer 24.

Step S13: A first groove is formed between the isolation region and the first channel region through the first opening, and the first groove is partially located in the isolation region and does not penetrate through the isolation region.

Figure 8:
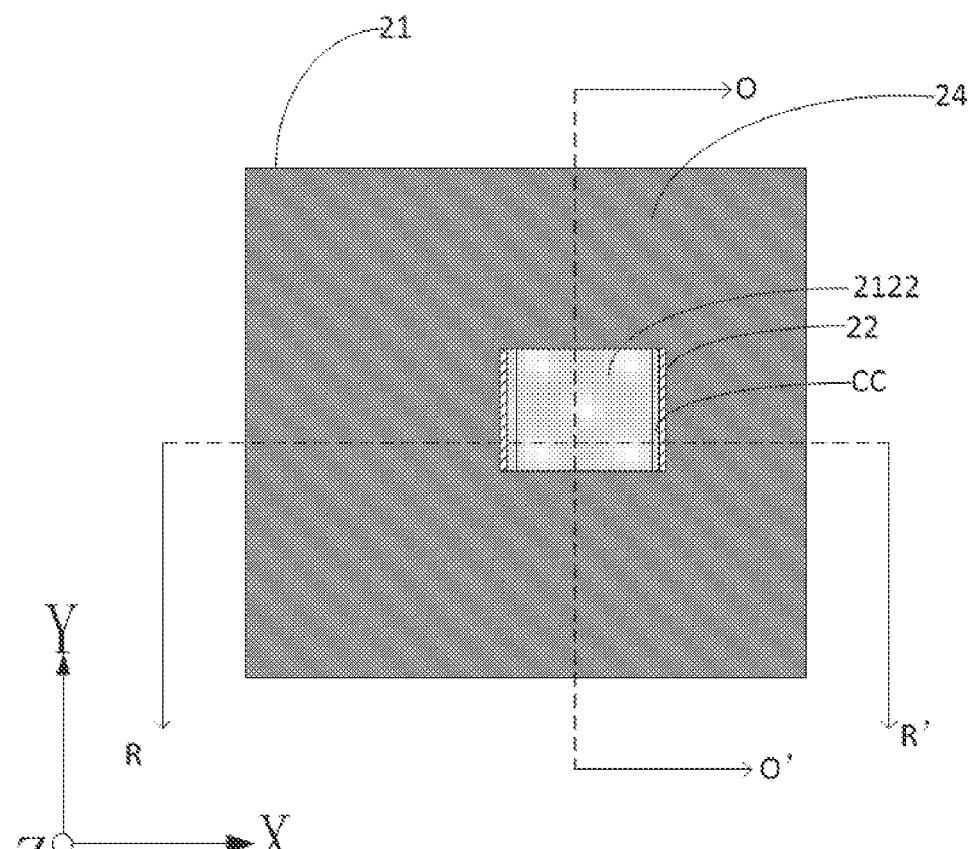
FIG. 8 is a schematic of top view structure after the completion of step S13 provided by an embodiment of the present application.
Figure 9:
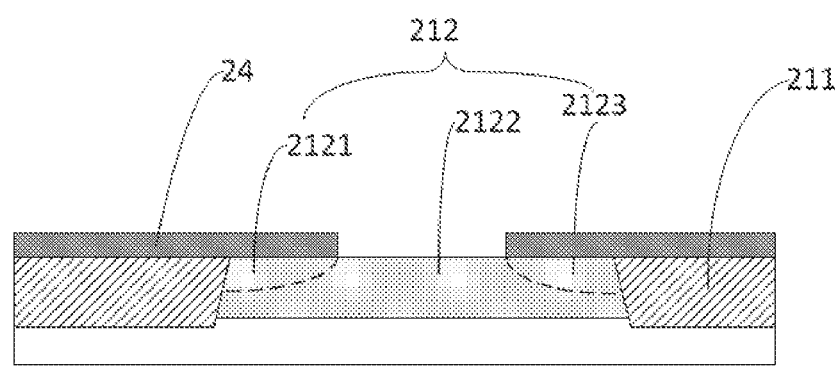
FIG. 9 is a schematic of cross-sectional structure taken along the line O-O' in FIG. 8.
Figure 10:
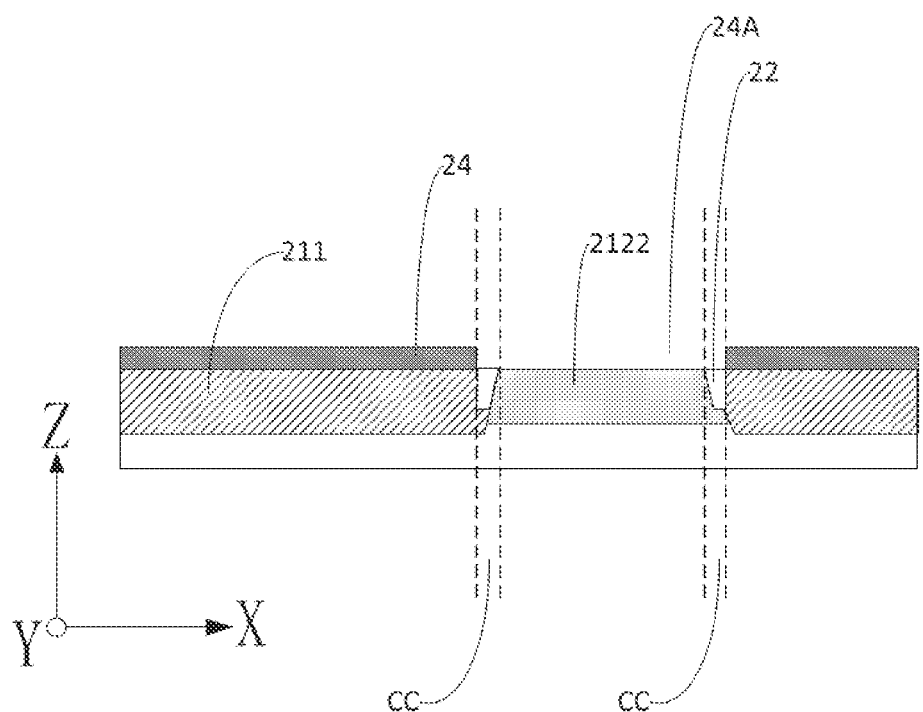
FIG. 10 is a schematic of cross-sectional structure taken along the line R-R' in FIG. 8.

Thereinto, the schematics of structure after the above-mentioned step S13 being completed are shown in FIG. 8, FIG. 9 and FIG. 10.

The depth of the above-mentioned first groove 22 in the longitudinal direction Z perpendicular to the substrate 21 may not be greater than the depth of the above-mentioned first channel region 2122 in the longitudinal direction Z, so as to avoid the substrate 21 located under the first channel region 2122 being exposed through the above-mentioned first groove 22, thereby reducing the impact on the performance of the transistor formed based on the first active region 212 in the subsequent steps.

In one specific embodiment, before the above-mentioned step S13, the method may further include:

Step A: A shallow trench isolation structure is formed in the shallow trench of the isolation region.

Correspondingly, the above-mentioned step S13 may include: forming a first groove between the shallow trench isolation structure and the first channel region through the first opening. The depth of the first groove in the longitudinal direction perpendicular to the substrate is smaller than that of the shallow trench isolation structure in the longitudinal direction.

Figure 11:
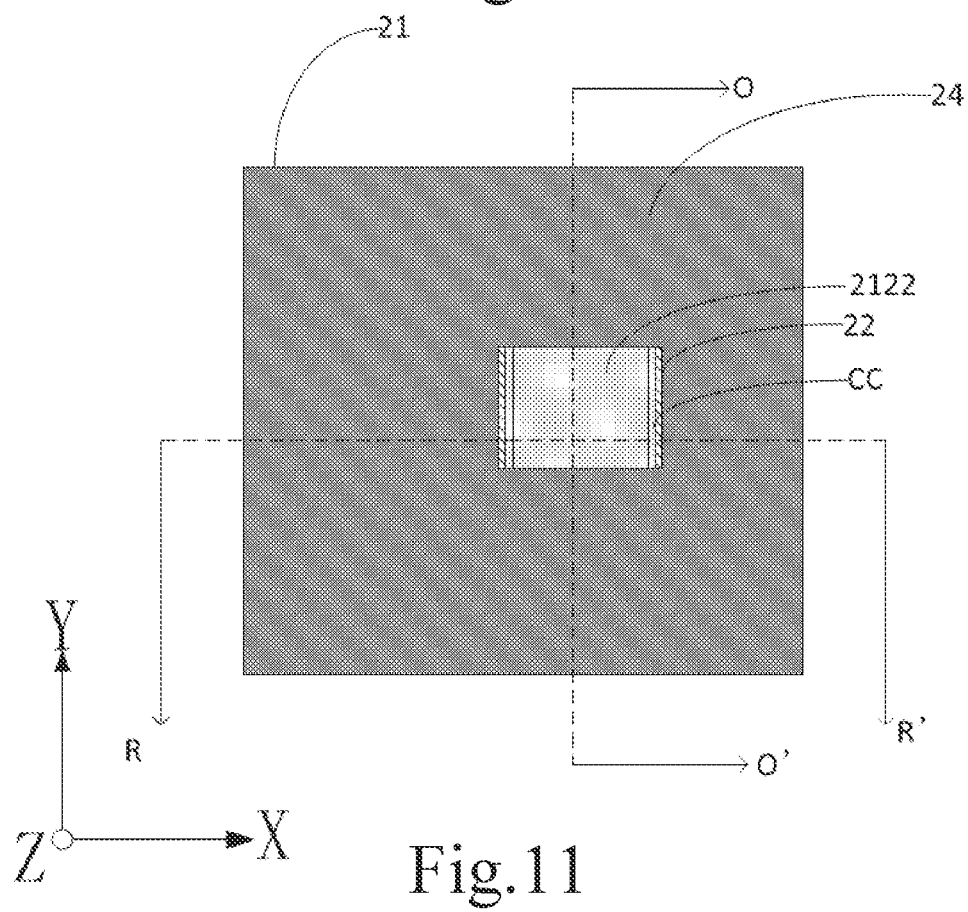
FIG. 11 is another schematic of top view structure after the completion of step S13 provided by an embodiment of the present application.
Figure 12:
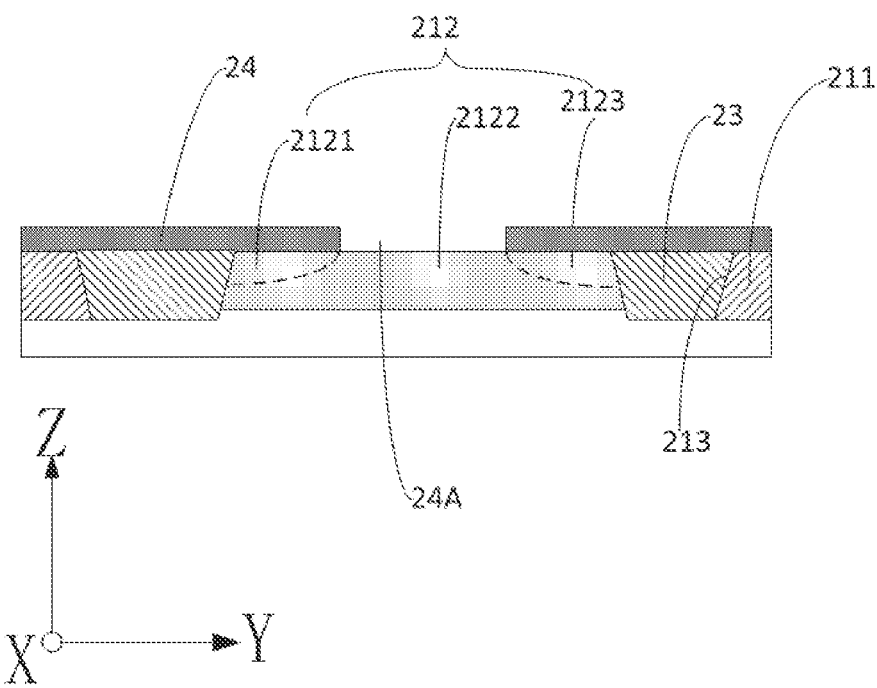
FIG. 12 is a schematic of cross-sectional structure taken along the line O-O' in FIG. 11.
Figure 13:
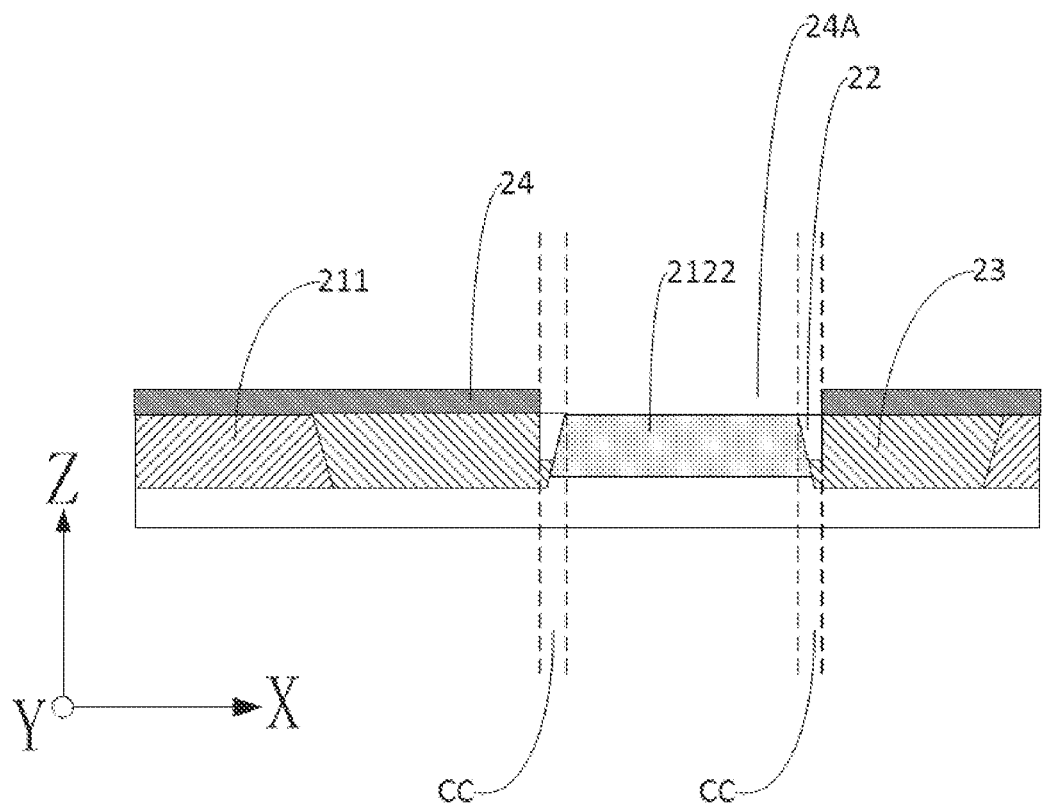
FIG. 13 is a schematic of cross-sectional structure taken along the line R-R' in FIG. 11.

The schematics of structure after the above-mentioned step S13 being completed are shown in FIG. 11, FIG. 12 and FIG. 13. The above-mentioned substrate 21 may include a shallow trench 213 formed in the isolation region 211 and located around the first active region 212. The shallow trench 213 is used to isolate the first active region 212 from other structures located around the first active region 212 to facilitate subsequent independent control of the transistor formed based on the first active region 212.

In addition, during specific implementing, the above-mentioned shallow trench 213 may be formed by etching a part of the substrate 21 in the above-mentioned isolation region 211, and then the shallow trench 213 is filled with an insulating material (such as silicon oxide) to obtain the above-mentioned trench isolation structure 23.

In some embodiments, the above-mentioned shallow trench 213 may be located at the top of the substrate 21, and the depth of the above-mentioned shallow trench 213 in the longitudinal direction Z perpendicular to the substrate 21 is not smaller than that of the first active region 212 in the longitudinal direction Z.

In some specific embodiments, as shown in FIG. 11, FIG. 12 and FIG. 13, a sidewall of the above-mentioned shallow trench 213 may be a slope, and the top size of the shallow trench 213 may be greater than the bottom size. Correspondingly, a sidewall of the above-mentioned shallow trench isolation structure 23 will also be a slope, and the top size of the shallow trench isolation structure 23 will also be greater than the bottom size.

In one specific embodiment, in order to form the above-mentioned first groove 22, the above-mentioned step S13 may include:

Step S131: A patterned second hard mask layer is formed on the patterned first hard mask layer, and the patterned second hard mask layer includes a second opening, the second opening being communicated with the first opening, and a part of the shallow trench isolation structure being exposed through the first opening and the second opening.

Step S132: A part of the shallow trench isolation structure exposed by the first opening and the second opening is selectively removed to obtain a first groove between the shallow trench isolation structure and the first channel region, and wherein the patterned second hard mask layer is used to protect the remaining shallow trench isolation structure from being removed during the course of selectively removing a part of the shallow trench isolation structure exposed by the first opening and the second opening.

Figure 14:
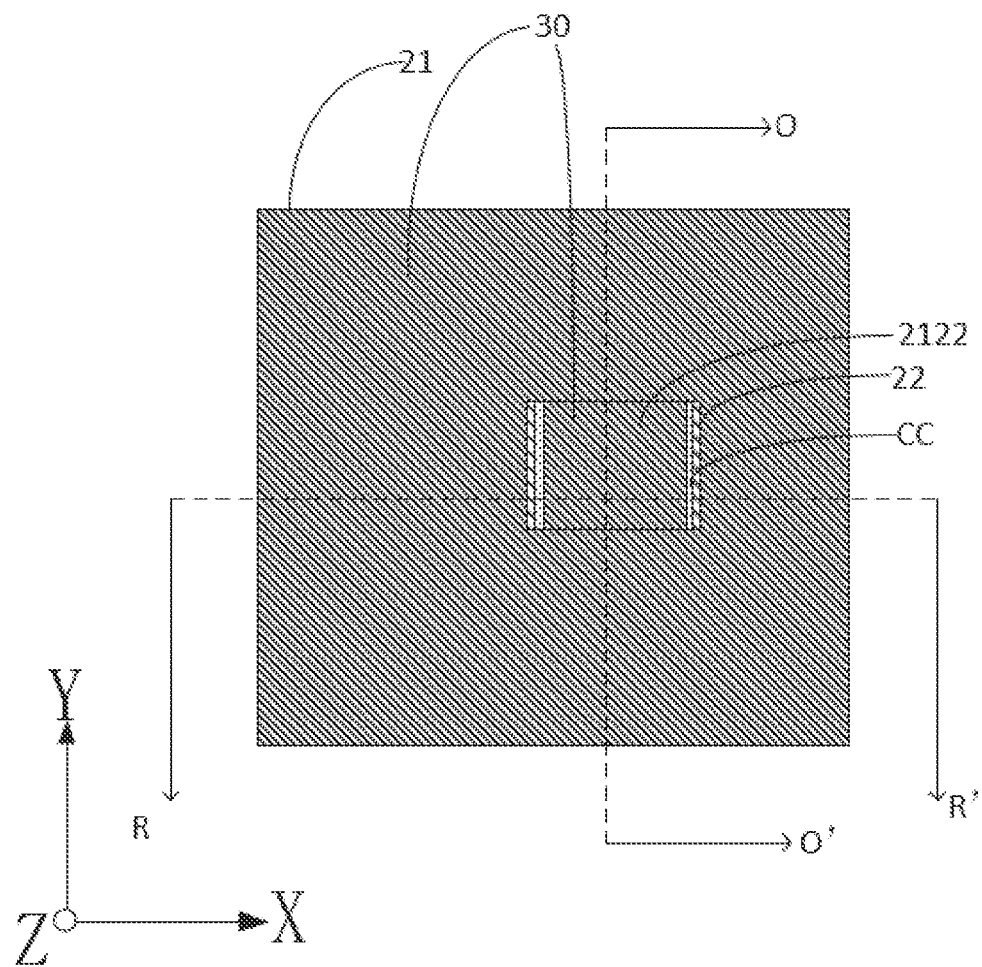
FIG. 14 is another schematic of top view structure after the completion of step S132 provided by an embodiment of the present application.
Figure 15:
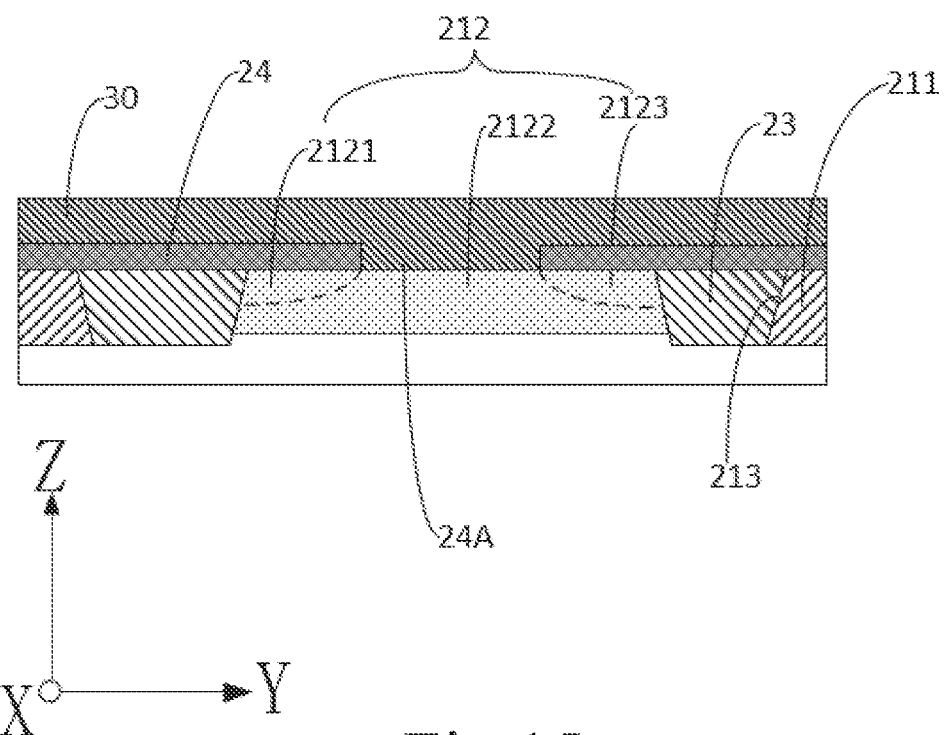
FIG. 15 is a schematic of cross-sectional structure taken along the line O-O' in FIG. 14.
Figure 16:
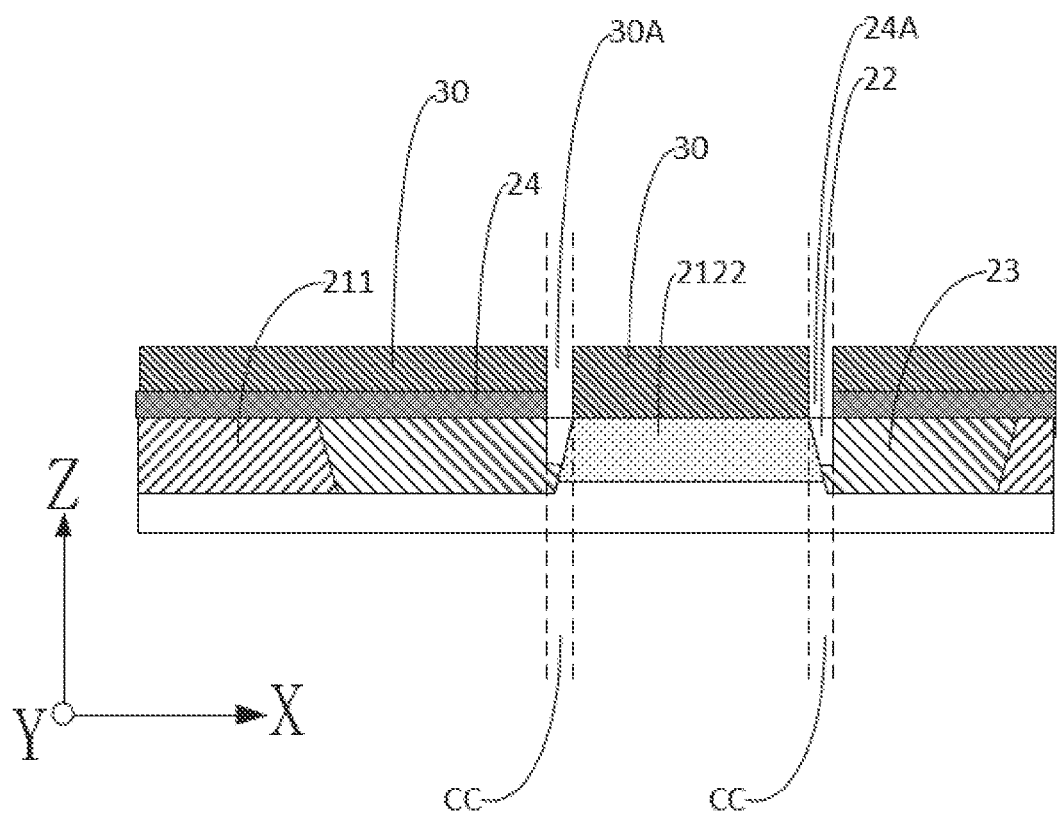
FIG. 16 is a schematic of cross-sectional structure taken along the line R-R' in FIG. 14.

Thereinto, the schematics of structure after step S132 being completed are shown in FIG. 14, FIG. 15 and FIG. 16.

The second opening 30A on the patterned second hard mask layer 30 is in communication with the first opening 24A on the above-mentioned patterned first hard mask layer 24, and the interface region CC where the above-mentioned shallow trench isolation structure 23 is connected with the above-mentioned first channel region 2122 may be exposed through the above-mentioned first opening 24A and second opening 30A. The above-mentioned first groove 22 is located at the interface region CC where the shallow trench isolation structure 23 is connected with the above-mentioned first channel region 2122. Thereinto, the above-mentioned patterned second hard mask layer is used to protect the remaining shallow trench isolation structure 23 from being removed during the course of selectively removing the shallow trench isolation structure 23 exposed by the above-mentioned first opening 24A and second opening. Thereinto, the remaining shallow trench isolation structure 23 may include the shallow trench isolation structure 23 exposed by other openings on the above-mentioned patterned first hard mask layer 24.

Step S14: A first gate insulating layer covering the first groove and the first channel region is formed.

Figure 17:
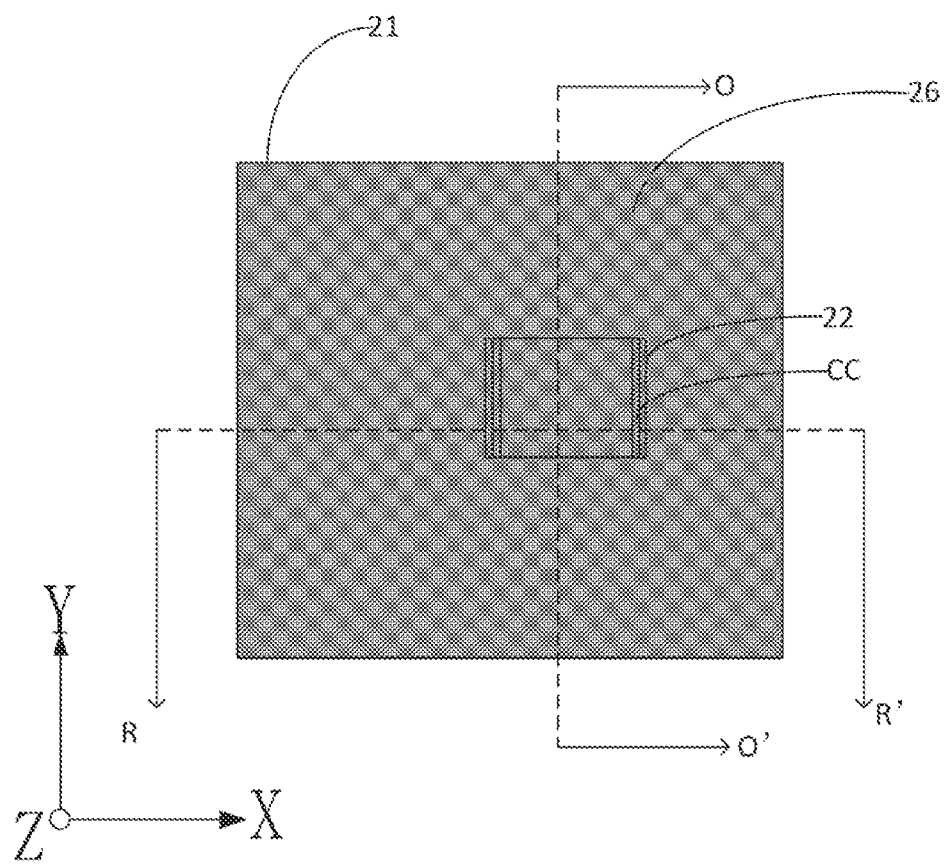
FIG. 17 is a schematic of top view structure after the completion of step S14 provided by an embodiment of the present application.
Figure 18:
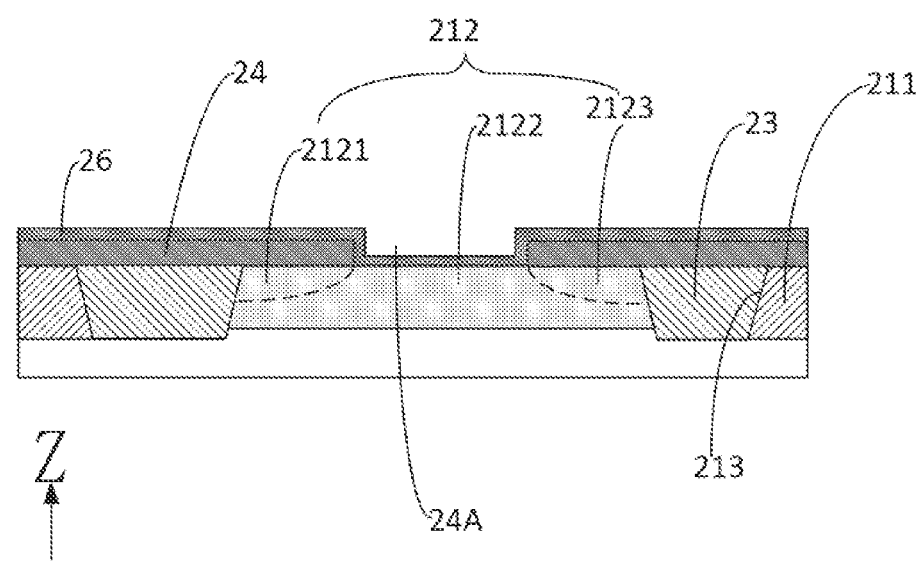
FIG. 18 is a schematic of cross-sectional structure taken along the line O-O' in FIG. 17.
Figure 19:
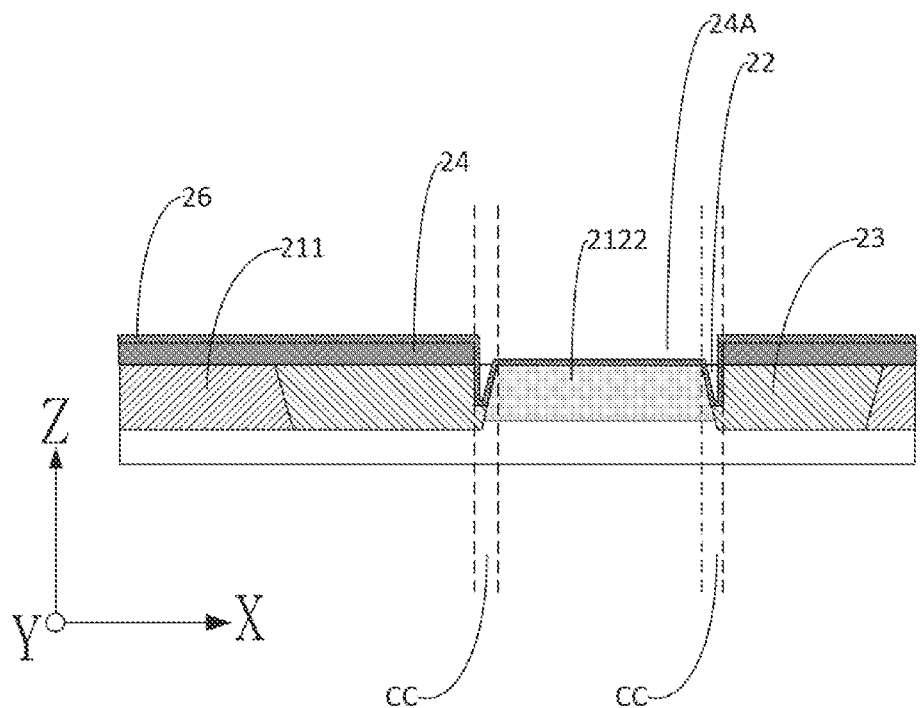
FIG. 19 is a schematic of cross-sectional structure taken along the line R-R' in FIG. 17.

Thereinto, the schematics of structure after step S14 being completed are shown in FIG. 17, FIG. 18 and FIG. 19.

The above-mentioned first gate insulating layer 26 is used to electrically isolate the gate and the channel of the transistor formed based on the above-mentioned first active region 212. Specifically, physical vapor deposition, chemical vapor deposition, atomic layer deposition, laser assisted deposition and the like can be used to deposit and form on the substrate 21 the first gate insulating layer 26 (for example, a silicon oxide layer) covering at least the above-mentioned first groove 22 and the above-mentioned first channel region 2122.

In addition, during specific implementing, the above-mentioned first gate insulating layer 26 may cover the above-mentioned patterned first hard mask layer 24, in addition to cover the above-mentioned first channel region 2122 and an inner wall surface of the above-mentioned first groove 22.

Step S15: A first gate is formed in the first opening and the first groove on the first gate insulating layer.

Figure 20:
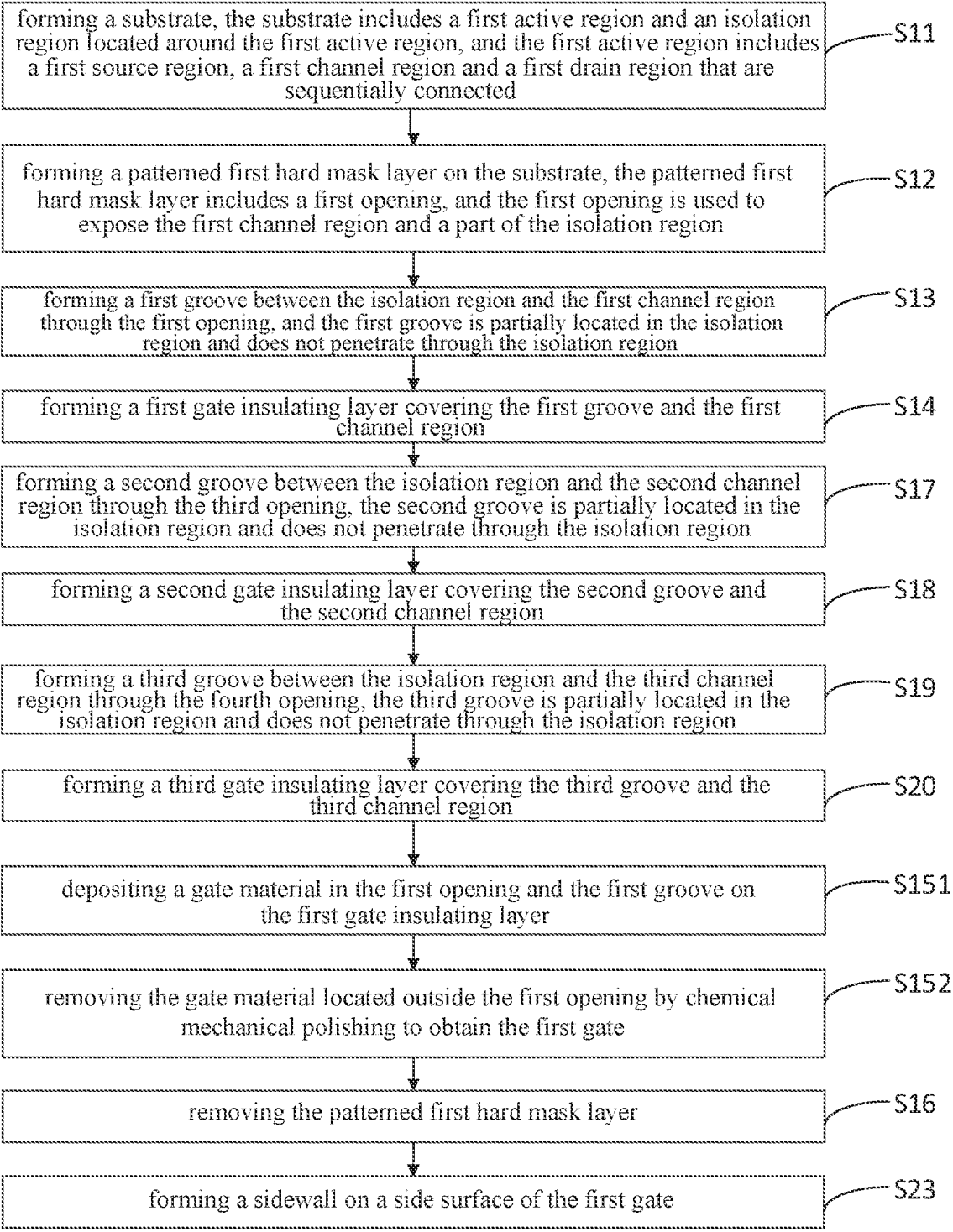
FIG. 20 is a schematic of another flow of the manufacturing method of a semiconductor device provided by an embodiment of the present application.

Thereinto, as shown in FIG. 20, the above-mentioned step S15 may include:

Step S151: A gate material is deposited in the first opening and the first groove on the first gate insulating layer.

Figure 21:
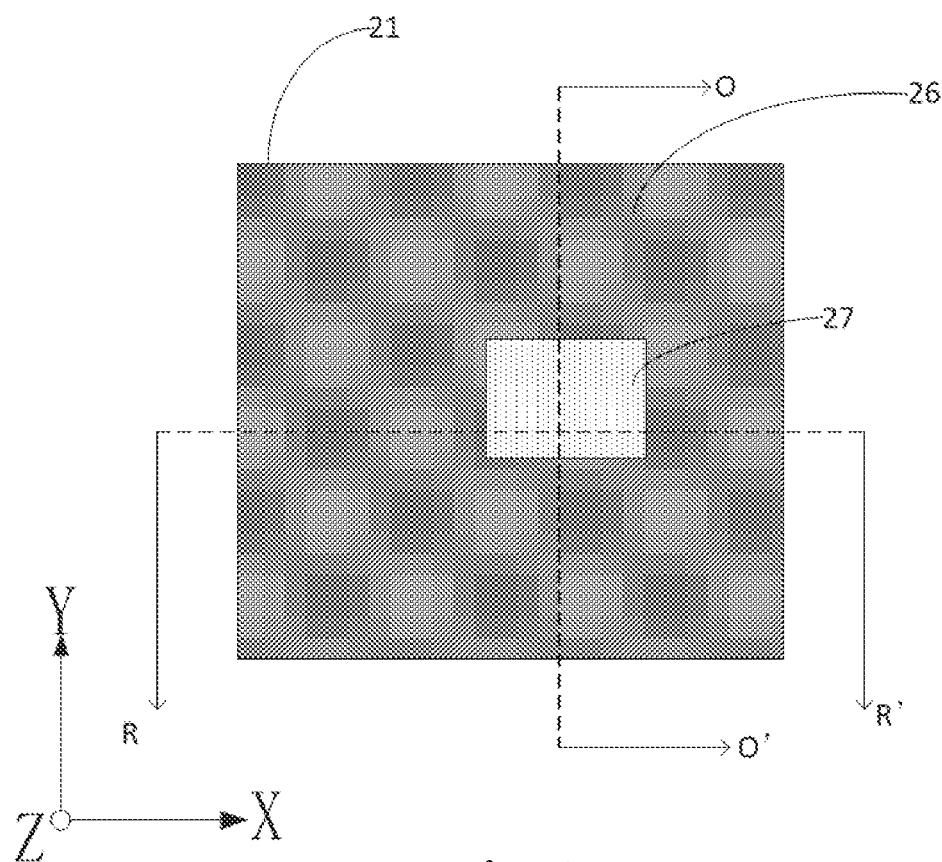
FIG. 21 is a schematic of top view structure after the completion of step S151 provided by an embodiment of the present application.
Figure 22:
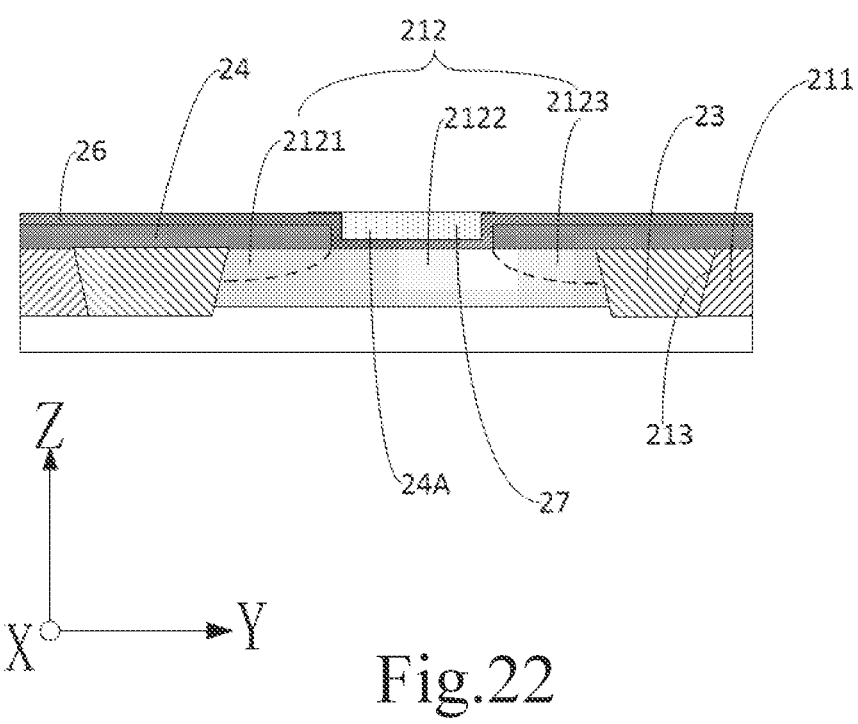
FIG. 22 is a schematic of cross-sectional structure taken along the line O-O' in FIG. 21.
Figure 23:
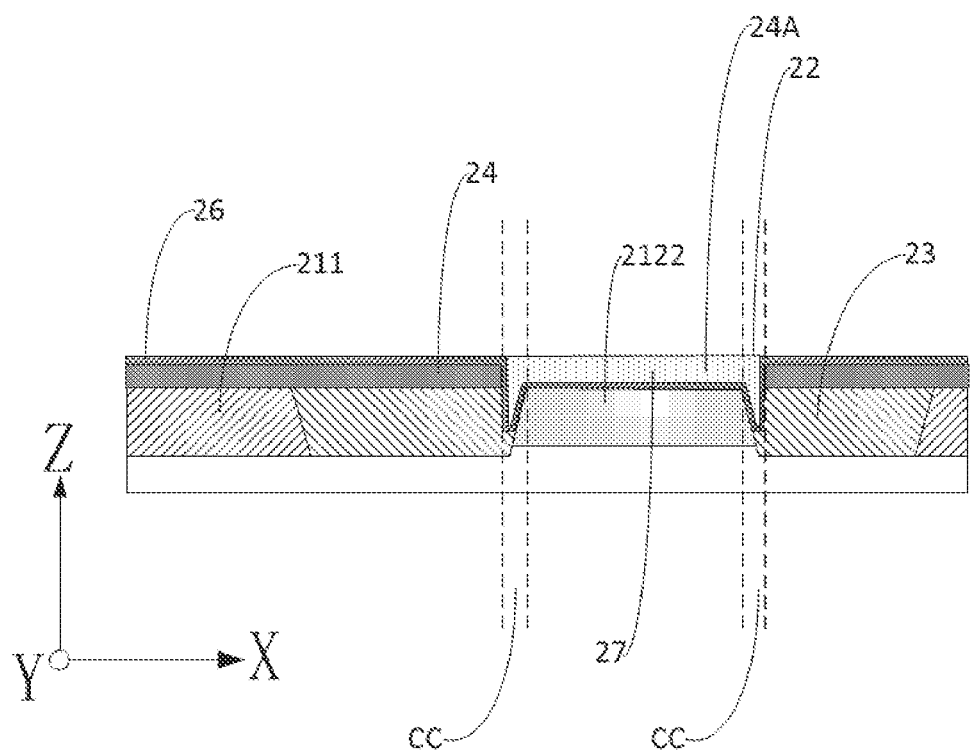
FIG. 23 is a schematic of cross-sectional structure taken along the line R-R' in FIG. 21.

Thereinto, the schematics of structure after the above-mentioned step S151 being completed are shown in FIG. 21, FIG. 22 and FIG. 23.

During the deposition course of the above-mentioned gate material 27 (for example, polysilicon), the above-mentioned first opening 24A will be filled with the gate material 27, and at the same time, the remaining space in the above-mentioned first groove 22 will be filled by the gate material 27.

Step S152: The gate material located outside the first opening is removed by chemical mechanical polishing to obtain the first gate.

Figure 24:
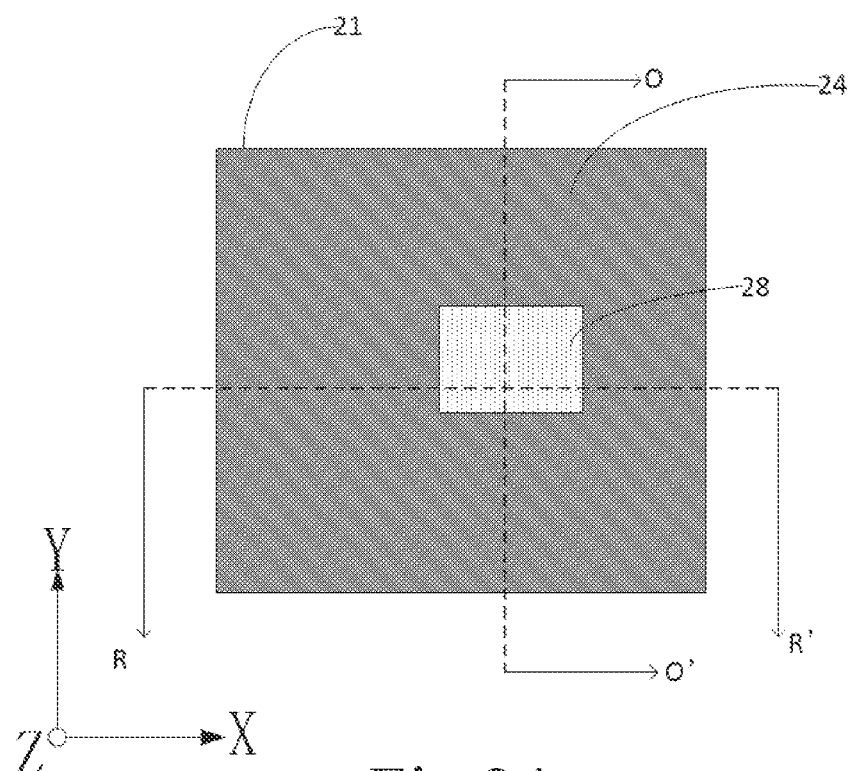
FIG. 24 is a schematic of top view structure after the completion of step S152 provided by an embodiment of the present application.
Figure 25:
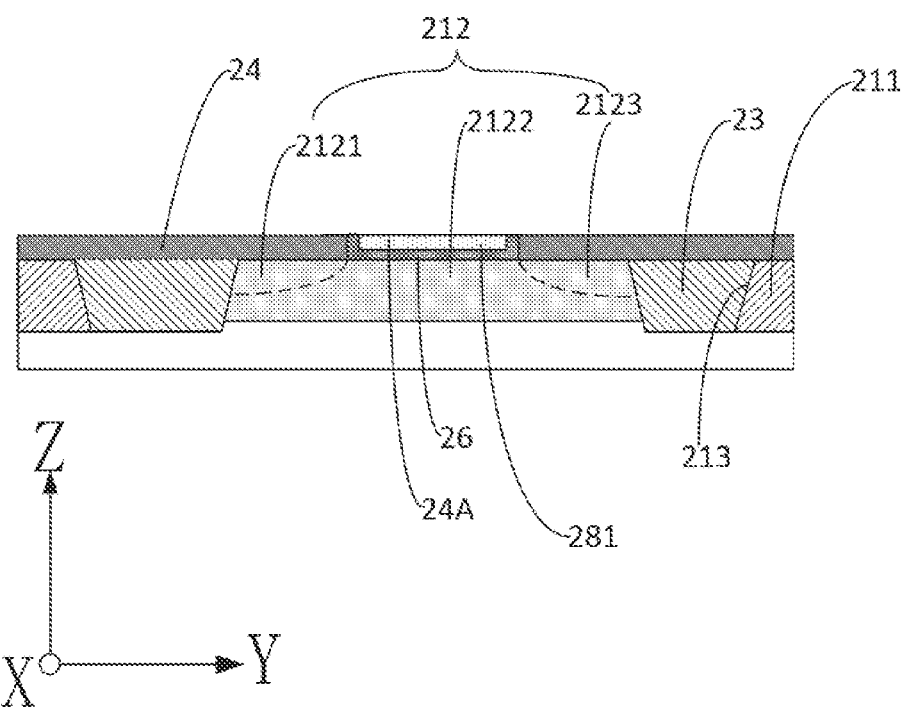
FIG. 25 is a schematic of cross-sectional structure taken along the line R-R' in FIG. 24.
Figure 26:
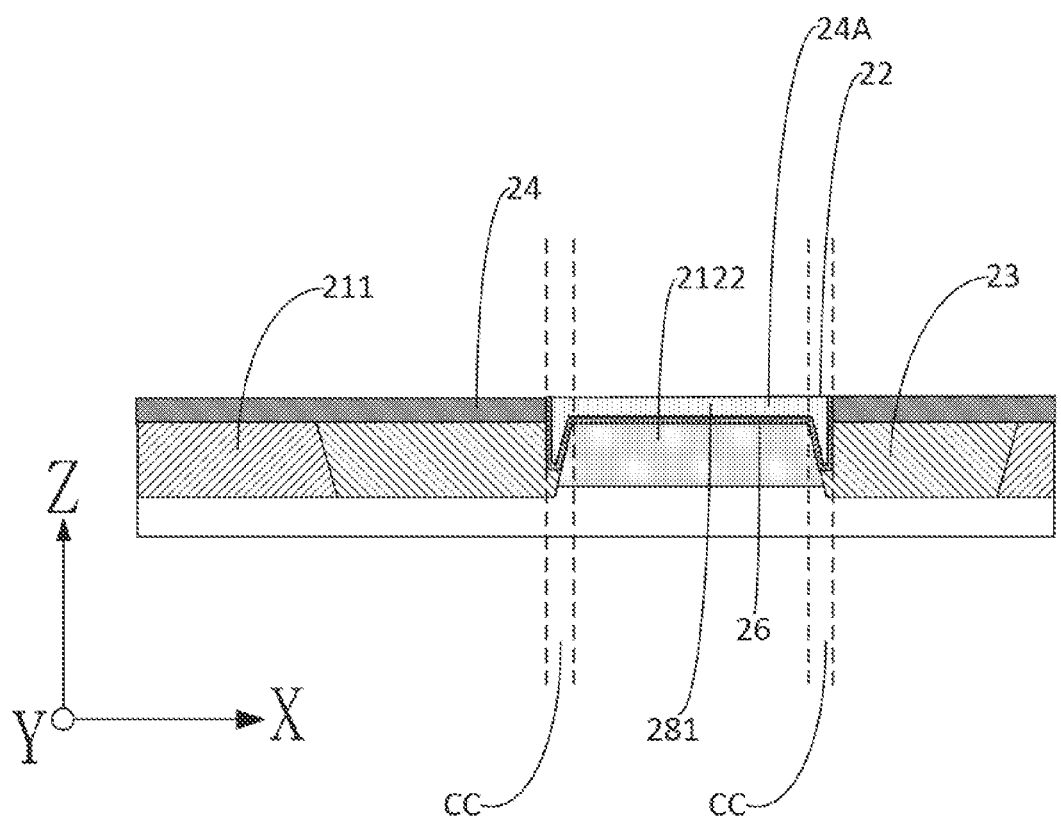
FIG. 26 is a schematic of cross-sectional structure taken along the line R-R' in FIG. 24.

Thereinto, the schematics of structure after the above-mentioned step S152 being completed are shown in FIG. 24, FIG. 25 and FIG. 26.

The sacrificial material overflowing the first opening 24A can be removed by a chemical mechanical polishing method to obtain a gate layer 28 having a first gate 281, and to make the above-mentioned first gate 281 having a flat top surface so as to facilitate the stability of the structure formed on the first gate 281 in the subsequent steps.

In some embodiments, during the course of removing the sacrificial material located outside the above-mentioned first opening 24A by a chemical mechanical polishing method, the first gate insulating layer 26 located on the above-mentioned patterned first hard mask layer 24 can also be removed to expose the top surface of the above-mentioned patterned first hard mask layer 24.

In this embodiment, the patterned hard mask layer is used to define the formation position of the gate. That is, the formation position of the gate is defined in the corresponding opening on the patterned hard mask layer, achieving the self-alignment of the gate. Thereafter, the gate is formed by simple and easy-to-implement methods such as deposition and chemical mechanical polishing and the like. Compared with forming the gate using an etching method, the technical solution of the embodiment of the present application can reduce the process difficulty increasing of etching to form the gate due to the reduction in the size of the transistor device. Therefore, the production cost is reduced.

Step S16: The patterned first hard mask layer is removed.

Figure 27:
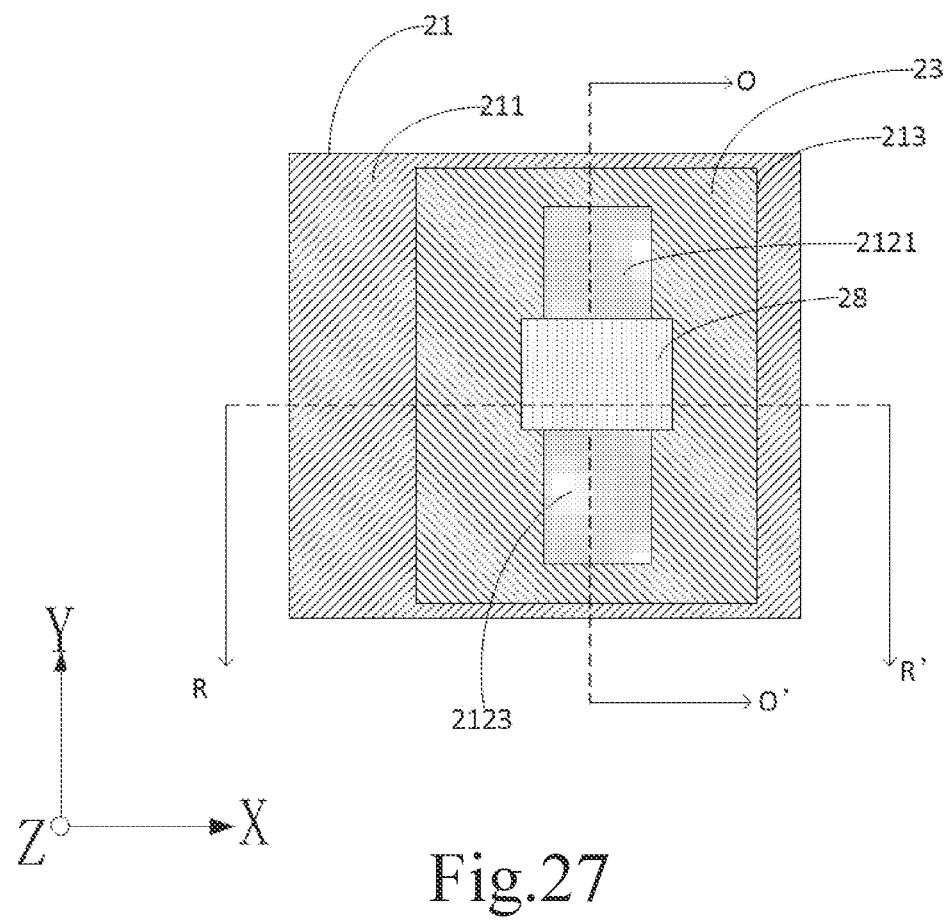
FIG. 27 is a schematic of top view structure after the completion of step S16 provided by an embodiment of the present application.
Figure 28:
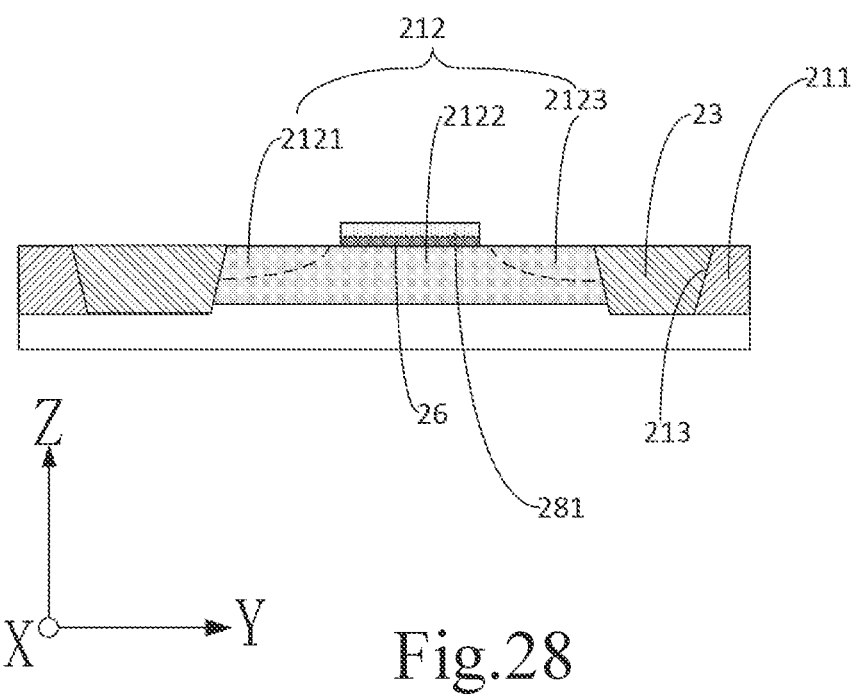
FIG. 28 is a schematic of cross-sectional structure taken along the line O-O' in FIG. 27.
Figure 29:
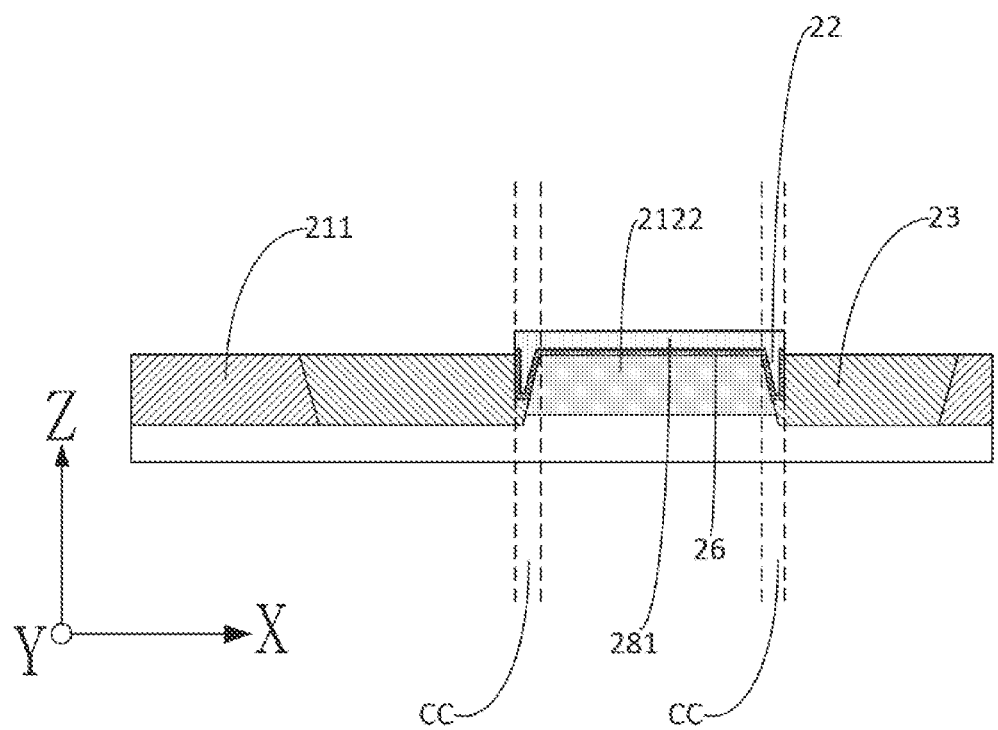
FIG. 29 is a schematic of cross-sectional structure taken along the line R-R' in FIG. 27.

Thereinto, the schematics of structure after the above-mentioned step S16 being completed are shown in FIG. 27, FIG. 28 and FIG. 29.

The above-mentioned patterned first hard mask layer 24 may be removed by an etching method (for example, a wet etching method). In some specific embodiments, during the course of removing the above-mentioned patterned first hard mask layer 24 by an etching method, the first gate insulating layer 26 located around the above-mentioned gate layer 28 may also be removed.

In this embodiment, the above-mentioned first gate 281 covers the first channel region 2122 of the above-mentioned first active region 212, and fills the first grove 22 located between the first channel region 2122 and the above-mentioned isolation region 211. As such, the gate in the transistor formed subsequently based on the first gate 281 and the first active region 212 can wrap the channel on the two opposite sides and the top surface of the channel, that is, it is equivalent to increasing the effective length of the gate or channel in the transistor, helping to improve the performance of the parameters such as the saturation current and leakage current and the like of the transistor.

In addition, during specific implementing, the first source region 2121, the first channel region 2122 and the first drain region 2123 in the above-mentioned first active region 212 may present a linear profile in a first lateral direction Y parallel to the substrate 21, and the two side ends of the first gate 281 in a second lateral direction X parallel to the substrate 21 and perpendicular to the first lateral direction Y may extend to a part of the isolation region 211 on two sides of the above-mentioned first channel region 2122 (for example, a part of the shallow trench isolation structure 23).

In the above-mentioned embodiment, a plurality of transistors are included in the above-mentioned semiconductor device, and the plurality of transistors may be divided into at least one transistor type (for example, high voltage transistor type, low voltage transistor type, ultra-low voltage transistor type, etc.) according to operating voltage (that is, gate turn-on voltage), wherein the gate-on voltage of the transistor of the high voltage transistor type is higher than that of the transistor of the low voltage transistor type, and the gate-on voltage of the transistor of the low voltage transistor type is higher than that of the transistor of the ultra-low voltage transistor type.

The above-mentioned first active region 212 may be used to form a transistor of one of the transistor types (for example, a transistor of a high voltage transistor type), that is, when there are a plurality of the above-mentioned first active regions 212, the plurality of transistors formed based on the plurality of first active regions 212 belong to the same transistor type. And, during specific implementing, a plurality of transistors of the same transistor type may be manufactured and obtained simultaneously through the above-mentioned step S11~step S16, and the plurality of transistors of the above-mentioned same transistor type may also be manufactured and obtained one by one or a plurality of times through the above-mentioned steps S11~step S16.

Figure 30:
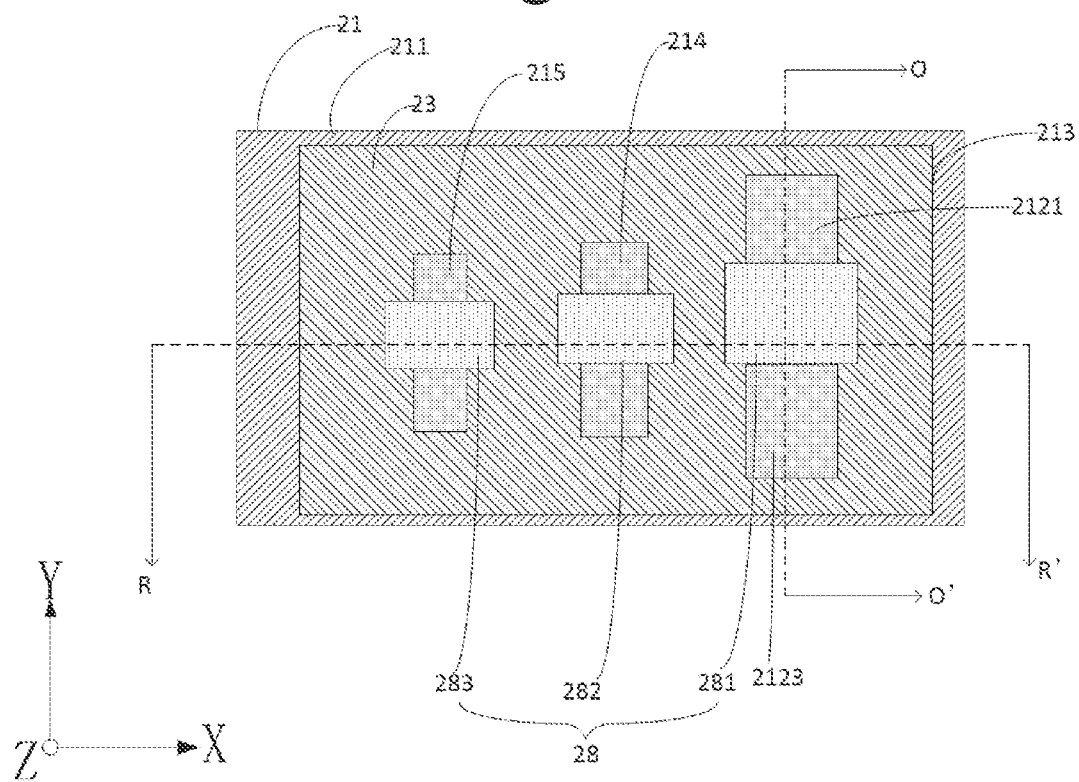
FIG. 30 is another schematic of top view structure after the completion of step S16 provided by an embodiment of the present application.
Figure 31:
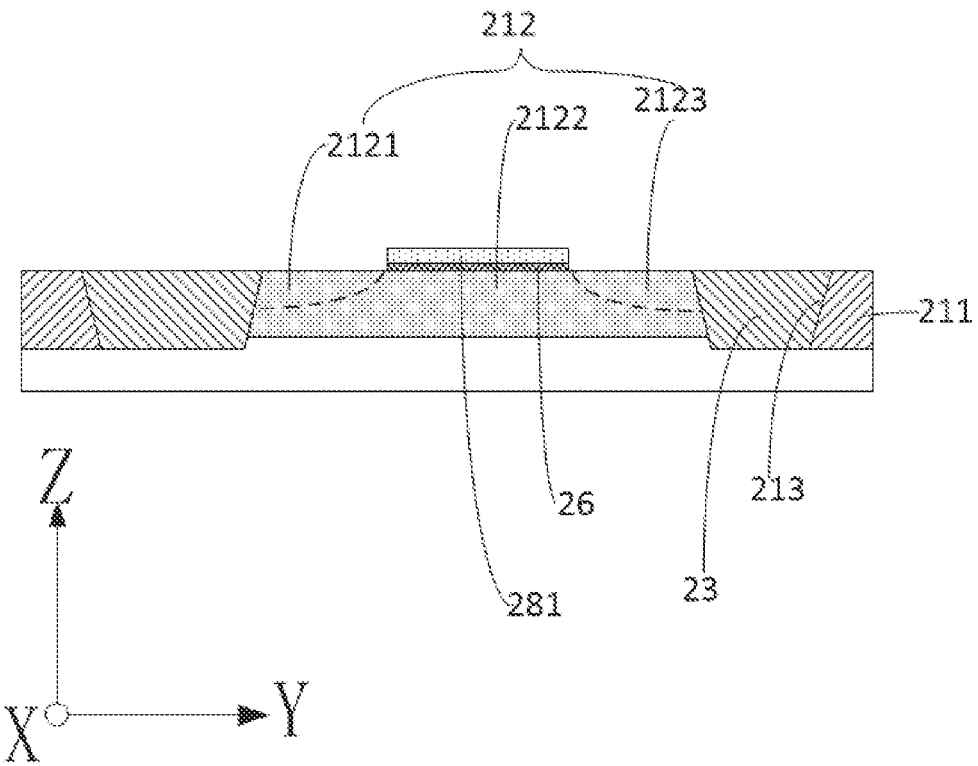
FIG. 31 is a schematic of cross-sectional structure taken along the line O-O' in FIG. 30.
Figure 32:
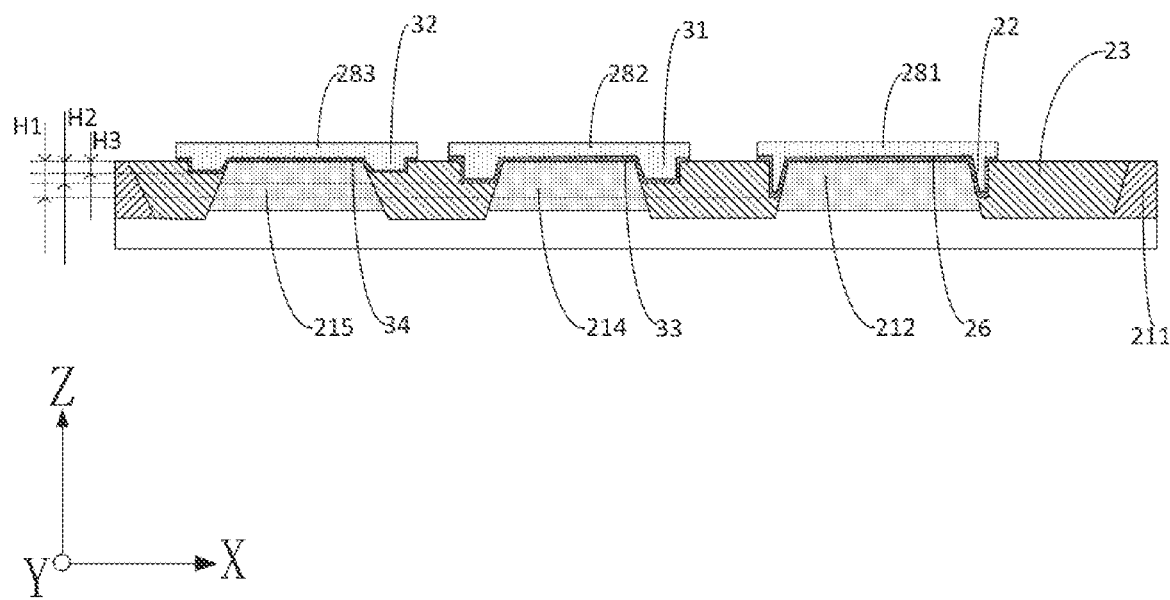
FIG. 32 is a schematic of cross-sectional structure taken along the line R-R' in FIG. 30.

In a specific embodiment, as shown in FIG. 30, FIG. 31 and FIG. 32, the above-mentioned substrate 21 may further include a second active region 214. The second active region 214 and the above-mentioned first active region 212 are spaced apart by the above-mentioned isolation regions 211. The second active region 214 may include a second source region, a second channel region and a second drain region that are sequentially connected. It can be understood that, similar to the above-mentioned first active region 212, the above-mentioned second active region 214 may also correspond to the active region of one transistor in the above-mentioned semiconductor device. The difference between the above-mentioned first active region 212 and the above-mentioned second active region 214 is in that, in the above-mentioned semiconductor device, the transistor formed based on the first active region 212 and the transistor formed based on the second active region 214 belong to different transistor types. For example, the transistor formed based on the first active region 212 may belong to a high voltage transistor type, and the transistor formed based on the second active region 214 may belong to a low voltage transistor type.

Correspondingly, the above-mentioned patterned first hard mask layer 24 may further include a third opening for exposing the second channel region of the above-mentioned second active region 214 and a part of the above-mentioned isolation region 211.

In order to form a corresponding transistor based on the above-mentioned second active region 214, as shown in FIG. 20, before the above-mentioned step S15, it may further include:

Step S17: A second groove is formed between the isolation region and the second channel region through the third opening, and the second groove is partially located in the isolation region and does not penetrate through the isolation region.

Thereinto, the specific implementation of the above-mentioned step S17 can refer to the specific implementation of the above-mentioned step S13, and it only needs to replace the first opening, the first channel region and the first groove in the specific implementation of the above-mentioned step S13 with a third opening, a second channel region and a second groove, to achieve the specific implementation of the above-mentioned step S17, so it will not be repeated here.

Step S18: A second gate insulating layer covering the second groove and the second channel region is formed.

Thereinto, the specific implementation of the above-mentioned step S18 can refer to the specific implementation of the above-mentioned step S14, and it only needs to replace the first groove, the first channel region and the first gate insulating layer in the specific implementation of the above-mentioned step S14 with a second groove, a second channel region and a second gate insulating layer, to achieve the specific implementation of the above-mentioned step S18, so it will not be repeated here.

In another specific embodiment, as shown in FIGS. 30, 31 and 32, the above-mentioned substrate 21 may further include a third active region 215, the third active region 215, the above-mentioned first active region 212 and the above-mentioned second active region 214 are spaced apart by the above-mentioned isolation region 211, and the third active region 215 may include a third source region, a third channel region and a third drain region that are sequentially connected. It can be understood that, similar to the above-mentioned first active region 212 and the above-mentioned second active region 214, the above-mentioned third active region 215 can also correspond to the active region of one transistor in the above-mentioned semiconductor device, and the difference from the above-mentioned first active region 212 and the above-mentioned second active region 214 is in that, in the above-mentioned semiconductor device, a transistor formed based on the third active region 215, a transistor formed based on the first active region 212 and a transistor formed based on the second active region 214 belong to different transistor types. For example, the transistor formed based on the first active region 212 may belong to the high voltage transistor type, the transistor formed based on the second active region 214 may belong to a low voltage transistor type, and the transistor formed based on the third active region 215 may belong to an ultra-low voltage transistor type.

Correspondingly, the above-mentioned patterned first hard mask layer 24 may further include a fourth opening for exposing the third channel region of the above-mentioned third active region 215, and an interface region where the above-mentioned isolation region 211 is connected with the third channel region.

In order to form a corresponding transistor based on the above-mentioned third active region 215, as shown in FIG. 20, before the above-mentioned step S15, it may further include:

Step S19: A third groove is formed between the isolation region and the third channel region through the fourth opening and the third groove is partially located in the isolation region and does not penetrate through the isolation region.

Thereinto, the specific implementation of the above-mentioned step S19 can refer to the specific implementation of the above-mentioned step S13, and it only needs to replace the first opening, the first channel region and the first groove in the specific implementation of the above-mentioned step S13 with a fourth opening, a third channel region and a third groove, to achieve the specific implementation of the above-mentioned step S19, so it will not be repeated here.

Step S20: A third gate insulating layer covering the third groove and the third channel region is formed.

Thereinto, the specific implementation of the above-mentioned step S20 can refer to the specific implementation of the above-mentioned step S14, and it only needs to replace the first groove, the first channel region and the first gate insulating layer in the specific implementation of the above-mentioned step S14 with a third groove, a third channel region and a third gate insulating layer, to achieve the specific implementation of the above-mentioned step S20, so it will not be repeated here.

In a specific embodiment, in order to form the above-mentioned second groove 31, the above-mentioned step S17 may include: forming a patterned third hard mask layer on the patterned first hard mask layer 24, and the patterned third hard mask layer includes a fifth opening which communicates with the third opening on the above-mentioned patterned first hard mask layer 24, and the interface region where the above-mentioned shallow trench isolation structure 23 is connected with the second channel region of the above-mentioned second active region 214 may be exposed through the above-mentioned third and fifth openings; the shallow trench isolation structure 23 exposed by the above-mentioned third and fifth openings is selectively removed to achieve the above-mentioned second groove 31 located in the interface region where the shallow trench isolation structure 23 is connected with the above-mentioned second channel region. Thereinto, the above-mentioned patterned third hard mask layer is used to protect the remaining shallow trench isolation structure 23 from being removed during the course of selectively removing the shallow trench isolation structure 23 exposed by the above-mentioned third and fifth openings. Thereinto, the remaining shallow trench isolation structure 23 may include the shallow trench isolation structure 23 exposed by other openings on the above-mentioned patterned first hard mask layer 24 (for example, the above-mentioned first opening 24A and the above-mentioned fourth opening).

In one specific embodiment, in order to form the above-mentioned third groove 32, the above-mentioned step S19 may include: forming a patterned fourth hard mask layer on the patterned first hard mask layer 24, and the patterned fourth hard mask layer includes a sixth opening which communicates with the fourth opening on the above-mentioned patterned first hard mask layer 24, and the interface region where the above-mentioned shallow trench isolation structure 23 is connected with the third channel region of the above-mentioned third active region 215 can be exposed through the above-mentioned fourth and sixth openings; selectively removing the shallow trench isolation structure 23 exposed by the above-mentioned fourth and sixth openings to achieve the above-mentioned third groove 32 located in the interface region where the shallow trench isolation structure 23 is connected with the above-mentioned third channel region. Thereinto, the above-mentioned patterned fourth hard mask layer is used to protect the remaining shallow trench isolation structure 23 from being removed during the course of selectively removing the shallow trench isolation structure 23 exposed by the above-mentioned fourth and sixth openings. Thereinto, the remaining shallow trench isolation structure 23 may include the shallow trench isolation structure 23 exposed by other openings on the patterned first hard mask layer 24 (for example, the above-mentioned first opening 24A and the above-mentioned third opening).

In the above embodiment, in order to ensure that the transistor formed based on the above-mentioned first active region 212 and the transistor formed based on the above-mentioned second active region 214 belong to different transistor types, the depth H2 of the above-mentioned second groove 31 in the longitudinal direction Z vertical to the substrate 21 can be disposed to be different from the depth H1 of the above-mentioned first groove 22 in the longitudinal direction Z, and/or the thickness of the second gate insulating layer 33 is different from the thickness of the first gate insulating layer 26.

For example, when the gate turn-on voltage of the transistor formed based on the above-mentioned first active region 212 is greater than the gate turn-on voltage of the transistor formed based on the above-mentioned second active region 214, for example, when the transistor formed based on the above-mentioned first active region 212 belongs to the high voltage transistor type and when the transistor formed based on the above-mentioned second active region 214 belongs to the low voltage transistor type, the depth H2 of the above-mentioned second groove 31 in the longitudinal direction Z vertical to the substrate 21 can be disposed to be smaller than the depth H1 of the first groove 22 in the longitudinal direction Z, and/or, the thickness of the above-mentioned second gate insulating layer 33 is smaller than the thickness of the first gate insulating layer 26.

By analogy, in order to ensure that the transistors formed based on the above-mentioned third active region 215 and the transistors formed based on the above-mentioned first active region 212 belong to different transistor types, the depth H3 of the above-mentioned third groove 32 in the longitudinal direction Z perpendicular to the substrate 21 can be disposed to be different from the depth H1 of the above-mentioned first groove 22 in the longitudinal direction Z, and/or the thickness of the above-mentioned third gate insulating layer 34 is different from the thickness of the above-mentioned first gate insulating layer. In other embodiments, in order to ensure that the transistor formed based on the above-mentioned third active region 215 and the transistor formed based on the above-mentioned second active region 214 belong to different transistor types, the depth H3 of the above-mentioned third groove 32 in the longitudinal direction Z perpendicular to the substrate 21 can be disposed to be different from the depth H2 of the above-mentioned second groove 31 in the longitudinal direction Z, and/or the thickness of the above-mentioned third gate insulating layer 34 is different from the thickness of the above-mentioned second gate insulating layer 33.

In one possible embodiment, the gate turn-on voltage of the transistor formed based on the above-mentioned first active region 212 may be greater than the gate turn-on voltage of the transistor formed based on the above-mentioned second active region 214, and the gate turn-on voltage of the transistor formed based on the above-mentioned second active region 214 may be greater than the gate turn-on voltage of the transistor formed based on the above-mentioned third active region 215. For example, the transistor formed based on the above-mentioned first active region 212 may belong to a high voltage transistor type, the transistor formed based on the above-mentioned second active region 214 may belong to a low voltage transistor type, and the transistor formed based on the above-mentioned third active region 215 may be belong to the ultra-low voltage transistor type.

Correspondingly, the depth H3 of the above-mentioned third groove 32 in the longitudinal direction Z perpendicular to the substrate 21 may be smaller than the depth H2 of the second groove 32 in the longitudinal direction Z, and the depth H2 of the second groove 31 in the longitudinal direction Z perpendicular to the substrate 21 may be smaller than the depth H1 of the first groove 22 in the longitudinal direction Z. Moreover, in some embodiments, the thickness of the above-mentioned third gate insulating layer 34 may be smaller than the thickness of the second gate insulating layer 33, and the thickness of the above-mentioned second gate insulating layer 33 may be smaller than the thickness of the first gate insulating layer 26.

It should be noted that for a transistor with a higher operating voltage (that is, gate turn-on voltage), the thicker its gate insulating layer is, the more beneficial it is to improve electrical characteristics parameters of the transistor device such as the saturation current, leakage current and the like, thereby improving the performance of the transistor. Moreover, in the above-mentioned embodiment, for a transistor with a high operating voltage, the deeper the groove between its channel and the above-mentioned isolation region 211 (that is, the above-mentioned first groove 22, second groove 31, or third groove 32) is, it is more helpful for improving control capability of the gate to the channel of the transistor, thereby improving the performance of the transistor.

In a possible implementation, the first groove 22, the second groove 31 and the third groove 32 may have the same depth in the longitudinal direction Z perpendicular to the substrate 21, and the first groove 22, the second groove 31 and the third groove 32 may be formed by the same process (for example, a single etching process). That is, the above-mentioned step S13, step S17 and step S19 may be the same etching process step, so that the above-mentioned first groove 22, second groove 31 and third groove 32 can be formed through one-step etching.

By analogy, in another possible implementation, the first gate insulating layer 26, the second gate insulating layer 33 and the third gate insulating layer 34 have the same thickness, then the first gate insulating layer 26, the second gate insulating layer 33 and the third gate insulating layer 34 can also be formed by the same process (for example, a single deposition process). That is, the above-mentioned step S14, step S18 and step S20 may be the same deposition process step, so that the above-mentioned first gate insulating layer 26, second gate insulating layer 33 and third gate insulating layer 34 can be formed by one-step deposition.

In other embodiments, when the above-mentioned first gate insulating layer 26, second gate insulating layer 33 and third gate insulating layer 34 have different thicknesses, the first gate insulating layer 26, the second gate insulating layer 33 and the third gate insulating layer 34 may be formed step by step in a decreasing order in thickness. In the above-mentioned embodiment, when the above-mentioned first groove 22, second groove 31 and third groove 32 have different depths, the first groove 22, the second groove 31 and the third groove 32 may be formed step by step in a sequentially decreasing order in depth.

For a specific example, when the depths of the first groove 22, the second groove 31 and the third groove 32 sequentially decrease, the above-mentioned first groove 22, first gate insulating layer 26, second groove 31, second gate insulating layer 33, third groove 32 and third gate insulating layer 34 may be formed step by step by performing the above-mentioned step S12, step S13, step S15, step S16, step S17 and step S18 in sequence.

In the above-mentioned embodiment, after the above-mentioned step S18, it may further include:

S21: A second gate is formed in the third opening and the second groove on the second gate insulating layer.

Thereinto, the specific implementation of the above-mentioned step S21 can refer to the specific implementation of the above-mentioned step S15, and it only needs to replace the first gate insulating layer, the first opening, the first groove and the first gate in the specific implementation of the above-mentioned step S15 respectively with the second gate insulating layer, the third opening, the second groove and the second gate respectively, to achieve the specific implementation of the above-mentioned step S21, so it will not be repeated here.

In some embodiments, after the above-mentioned step S20, it may further include:

S22: A third gate is formed in the fourth opening and the third groove on the third gate insulating layer.

Thereinto, the specific implementation of the above-mentioned step S22 can refer to the specific implementation of the above-mentioned step S15, and it only needs to replace the first gate insulating layer, the first opening, the first groove and the first gate in the specific implementation of the above-mentioned step S15 respectively with the third gate insulating layer, the fourth opening, the third groove and the third gate respectively, to achieve the specific implementation of the above-mentioned step S22, so it will not be repeated here.

The schematics of structure after the above-mentioned step S22 being completed are shown in FIG. 30, FIG. 31 and FIG. 32, the first gate 281, a second gate 282 and the third gate 283 are disposed to be spaced and insulated. The second gate 282 covers the above-mentioned second channel region and fills the second groove 31 located between the isolation region 211 and the second channel region. The third gate 283 covers the above-mentioned third channel region and fills the third groove 32 located between the isolation region 211 and the third channel region.

In addition, during specific implementing, the gates of different transistors in the above-mentioned semiconductor device (for example, the first gate 281, the second gate 282 and the third gate 283) can be formed by the same process, or can be formed by a plurality of processes.

For example, when the gates of different transistors in the above-mentioned semiconductor device are formed by the same process, the above-mentioned first gate 281, second gate 282 and third gate 283 may be formed by the same process. That is, the above-mentioned step S15, step S21 and step S22 may be the same process step, so that the above-mentioned gate layer 28 including the first gate 281, the second gate 282 and the third gate 283 can be formed through one process step.

As such, using the manufacturing method for a semiconductor device in this embodiment, transistors with gate insulating layers of different thicknesses, and transistors with grooves(for example, the above-mentioned first groove 22, second groove 31 and third groove 32) of different depths between the channel and the above-mentioned isolation region 211 can be manufactured and obtained, which in turn can meet the diversified requirements of the gate insulating layer thickness and the contact area between the gate and the channel side in the transistors of different operating voltages in the semiconductor device.

In the above-mentioned embodiment, the above-mentioned semiconductor device may be a peripheral circuit chip of a memory (for example, a 3D NAND memory), and a plurality of transistors may be integrated in the peripheral circuit chip, and the plurality of transistors may belong to different transistor types.

In the above-mentioned embodiment, as shown in FIG. 20, after the above-mentioned step S16, that is, after the above-mentioned gate layer 28 is formed, the manufacturing method of the above-mentioned semiconductor device may further include:

Step S23: A sidewall is formed on a side surface of the first gate.

Figure 33:
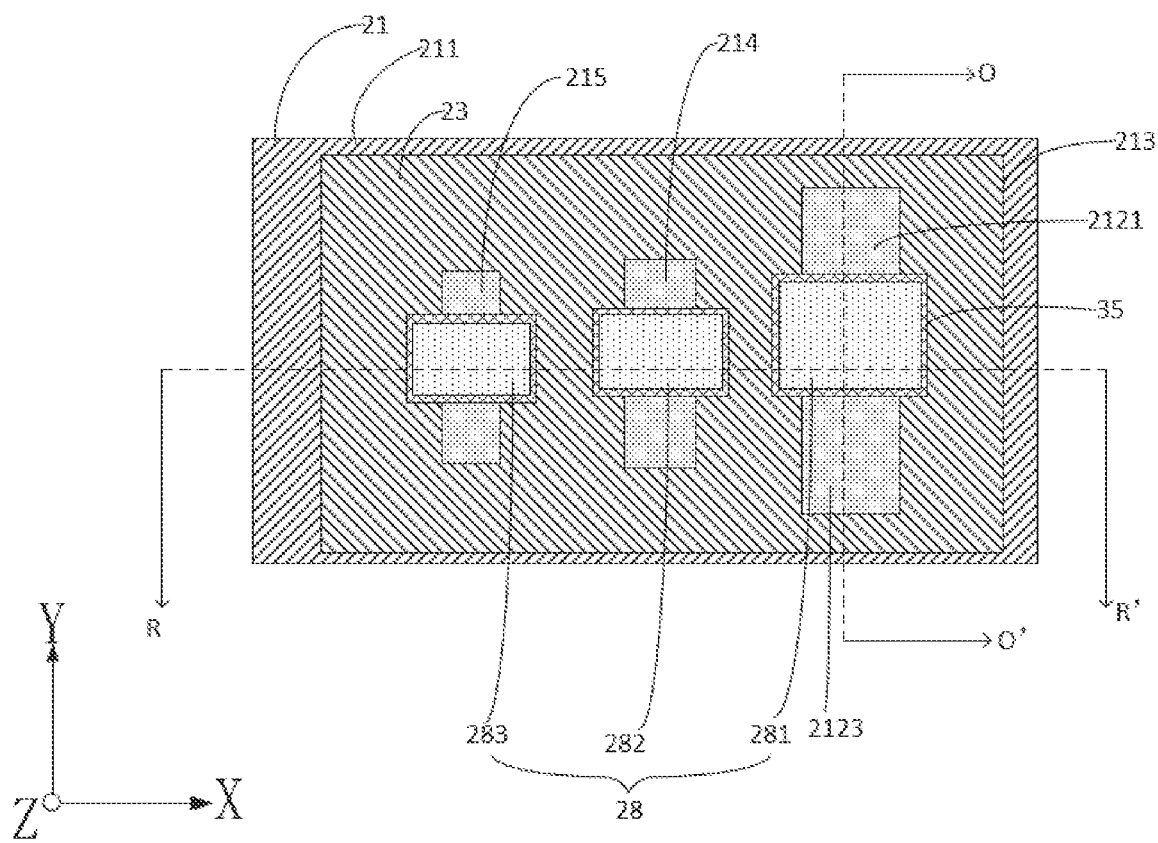
FIG. 33 is another schematic of top view structure after the completion of step S23 provided by an embodiment of the present application.
Figure 34:
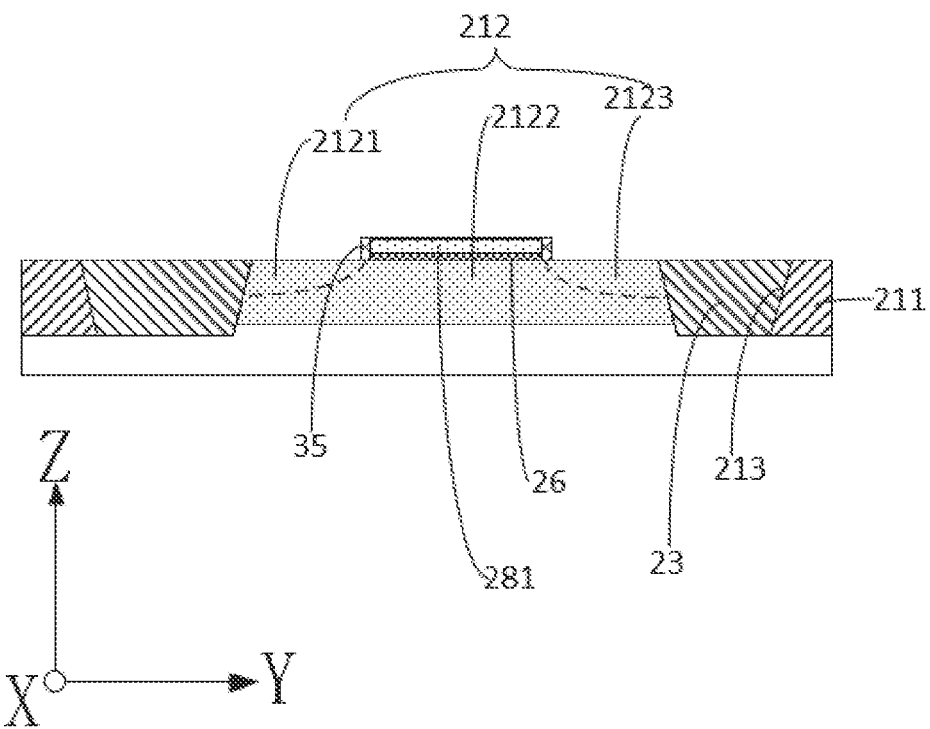
FIG. 34 is a schematic of cross-sectional structure taken along the line O-O' in FIG. 33.
Figure 35:
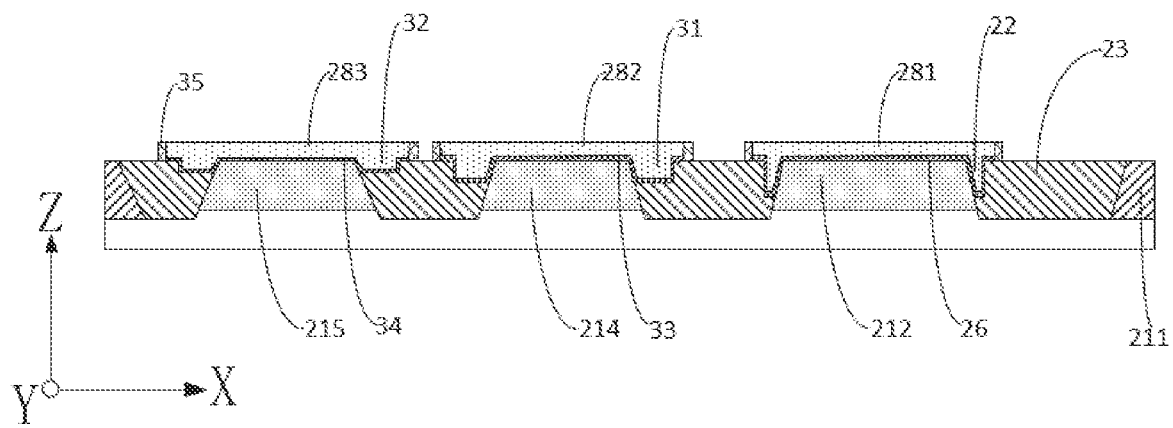
FIG. 35 is a schematic of cross-sectional structure taken along the line R-R' in FIG. 33.

Thereinto, the schematic of structure after step S23 being completed is shown in FIG. 33, FIG. 34 and FIG. 35.

The above-mentioned sidewall 35 may be formed, by sequentially adopting a deposition process and an etching process, on the side surfaces (for example, four side surfaces of the front, rear, left and right sides) of the various gates of the above-mentioned gate layer 28 (for example, the above-mentioned first gate 281, the above-mentioned second gate 281 and the above-mentioned third gate 281). Thereinto, the material of the sidewall can be an insulating material such as silicon oxide and the like, and the sidewall 35 is used to protect the above-mentioned gate and can reduce the hot carrier injection (HCI) effect.

In one specific embodiment, the above-mentioned semiconductor device may include a transistor of high voltage transistor type, a transistor of low voltage transistor type and a transistor of ultra-low voltage transistor type at the same time, and the specific flow of forming the semiconductor device may be as follows:

Step S1-1: A substrate is formed. The substrate includes a first active region, a second active region, a third active region and an isolation region by which the first active region, the second active region and the third active region are spaced apart, wherein the first active region includes a first source region, a first channel region and a first drain region that are sequentially connected, the second active region includes a second source region, a second channel region and a second drain region that are sequentially connected, and the third active region includes a third source region, a third channel region and a third drain region that are sequentially connected.

Step S1-2: A patterned first hard mask layer is formed on the substrate. The patterned first hard mask layer includes a first opening, a third opening and a fourth opening. The first opening is used to expose the first channel region and a part of the isolation region, the third opening is used to expose the second channel region and a part of the isolation region, and the fourth opening is used to expose the third channel region and a part of the isolation region.

Step S1-3: A first groove is formed between the isolation region and the first channel region through the first opening, and the first groove is partially located in the isolation region and does not penetrate through the isolation region.

Step S1-4: A first gate insulating layer covering the first groove and the first channel region is formed.

Step S1-5: A second groove is formed between the isolation region and the second channel region through the third opening, and the second groove is partially located in the isolation region and does not penetrate through the isolation region.

Step S1-6: A second gate insulating layer covering the second groove and the second channel region is formed.

Step S1-7: A third groove is formed between the isolation region and the third channel region through the fourth opening, and the third groove is partially located in the isolation region and does not penetrate through the isolation region.

Step S1-8: A third gate insulating layer covering the third groove and the third channel region is formed.

Step S1-9: A first gate is formed in the first opening and the first groove on the first gate insulating layer, a second gate is formed in the third opening and the second groove on the second gate insulating layer, and a third gate is formed in the fourth opening and the third groove on the third gate insulating layer.

Step S1-10: The patterned first hard mask layer is removed.

Step S1-11: Sidewalls are formed on the side surface of the first gate, the side surface of the second gate and the side surface of the third gate.

Thereinto, the first active region, the second active region and the third active region may have different sizes, for example, the cross-sectional area of the first active region, the cross-sectional area of the second active region and the cross-sectional area of the third active region can decrease sequentially.

Thereinto, the first groove, the second groove and the third groove may have different depths, for example, the depth of the first groove, the depth of the second groove and the depth of the third groove may decrease sequentially.

Thereinto, the first gate insulating layer, the second gate insulating layer and the third gate insulating layer may have different thicknesses, for example, the thickness of the first gate insulating layer, the thickness of the second gate insulating layer and the thickness of the third gate insulating layer can decrease sequentially.

It is understood that the specific implementation of the above-mentioned step S1-1 may refer to the specific implementation of the above-mentioned step S11, the specific implementation of the above-mentioned step S1-2 may refer to the specific implementation of the above-mentioned step S12, the specific implementation of the above-mentioned step S1-3 may refer to the specific implementation of the above-mentioned step S13, the specific implementation of the above-mentioned step S1-4 may refer to the specific implementation of the above-mentioned step S14, the specific implementation of the above-mentioned step S1-5 may refer to the specific implementation of the above-mentioned step S17, the specific implementation of the above-mentioned step S1-6 may refer to the specific implementation of the above-mentioned step S18, the specific implementation of the above-mentioned step S1-7 may refer to the specific implementation of the above-mentioned step S19, the specific implementation of the above-mentioned step S1-8 can refer to the specific implementation of the above-mentioned step S20, the specific implementation of the above-mentioned steps S1-9 can refer to the specific implementations of the above-mentioned step S15, step S21 and step S22, the specific implementation of the above-mentioned step S1-10 may refer to the specific implementation of the above-mentioned step S16, and the specific implementation of the above-mentioned step S1-11 may refer to the specific implementation of the above-mentioned step S23, so it will not be repeated here.

The manufacturing method for a semiconductor device in this embodiment, by forming a substrate which includes a first active region and an isolation region located around the first active region which includes a first source region, a first channel region and a first drain region sequentially connected, and forming a patterned first hard mask layer on the substrate which includes a first opening used to expose the first channel region and a part of the isolation region, and then forming a first groove between the isolation region and the first channel region through the first opening with the first groove being partially located in the isolation region and not penetrating through the isolation region, and then forming a first gate insulating layer covering the first groove and the first channel region and forming a first gate in the first opening and the first groove on the first gate insulating layer, followed by removing the patterned first hard mask layer, can increase the effective length of the gate to improve the control of the gate to the transistor channel, and thus, while reducing the transistor device size, can improve electrical characteristic parameters of the transistor such as the saturation current, the leakage current and the like, improve the performance of the transistor device, and there is no need to etch the gate material layer to form the gate, avoiding the problem of the increase in the process difficulty of forming the gate by etching the gate material layer due to the reducing of the transistor device size, which in turn leads to the increase of production costs, and reducing production costs.

The semiconductor device manufactured according to the above-mentioned method embodiments of the present application is shown in FIG. 27, FIG. 28 and FIG. 29 and the semiconductor device includes: a substrate 21 which includes a first active region 212 and an isolation region 211 located around the first active region 212, the first active region 212 includes a first source region 2121, a first channel region 2122 and a first drain region 2123 that are sequentially connected; a first groove 22 located between the isolation region 211 and the first channel region 2122, the first groove 22 is partially located in the isolation region 211 and does not penetrate through the isolation region 211; a first gate insulating layer 26 covering the first groove 22 and the first channel region 2122; a first gate 281 located on the first gate insulating layer 26, and the first gate 281 covers the first channel region 2122 and fills the above-mentioned first groove 22.

In one specific embodiment, as shown in FIG. 30, FIG. 31 and FIG. 32, the above-mentioned substrate 21 may further include a second active region 214, and the first active region 212 and the second active region 214 are spaced apart by the above-mentioned isolation region 211, and the second active region 214 includes a second source region, a second channel region and a second drain region that are sequentially connected.

The above-mentioned semiconductor device may further include a second groove 31 located between the above-mentioned isolation region 211 and the above-mentioned second channel region, the second groove 31 is partially located in the isolation region 211 and does not penetrate through the isolation region 211. Further, the above-mentioned semiconductor device may further include a second gate insulating layer 33 covering the above-mentioned second groove 31 and the above-mentioned second channel region. Thereinto, the thickness of the second gate insulating layer 33 is different from the thickness of the first gate insulating layer 26, for example, the thickness of the above-mentioned second gate insulating layer 33 may be smaller than the thickness of the above-mentioned first gate insulating layer 26.

In one specific embodiment, the above-mentioned semiconductor device may further include a second gate 282 which covers the above-mentioned second channel region and the above-mentioned second groove 31.

Thereinto, the depth of the above-mentioned second groove 31 in the longitudinal direction Z perpendicular to the substrate 21 is smaller than the depth of the above-mentioned first groove 22 in the longitudinal direction Z.

In some embodiments, the above-mentioned substrate 21 may further include a shallow trench disposed in the isolation region 211 and located around the first active region 212. The above-mentioned peripheral device 200 may further include a shallow trench isolation structure 23 located in the shallow trench. The above-mentioned first groove 22 may be located between the shallow trench isolation structure 23 and the first channel region, and the depth of the first groove 22 in the longitudinal direction Z perpendicular to the substrate 21 may be smaller than the depth of the shallow trench isolation structure 23 in the longitudinal direction Z.

In some embodiments, the above-mentioned semiconductor device may further include a sidewall disposed on the side surface of the first gate 281.

It should be noted that, the various structures of the semiconductor device in this embodiment may refer to the specific implementation described in the above-mentioned method embodiment, and thus will not be repeated here.

The semiconductor device provided by this embodiment improves the control of the gate to the transistor channel by increasing the effective length of the gate, thereby while reducing the transistor device size, being capable of improving electrical characteristic parameters of the transistor such as the saturation current, the leakage current and the like, improving the performance of the transistor device, and there is no need to etch the gate material layer to form the gate, avoiding the problem of the increase in the process difficulty of forming the gate by etching the gate material layer due to the reducing of the transistor device size, which in turn leads to the increase of production costs, and reducing production costs.

Figure 36:
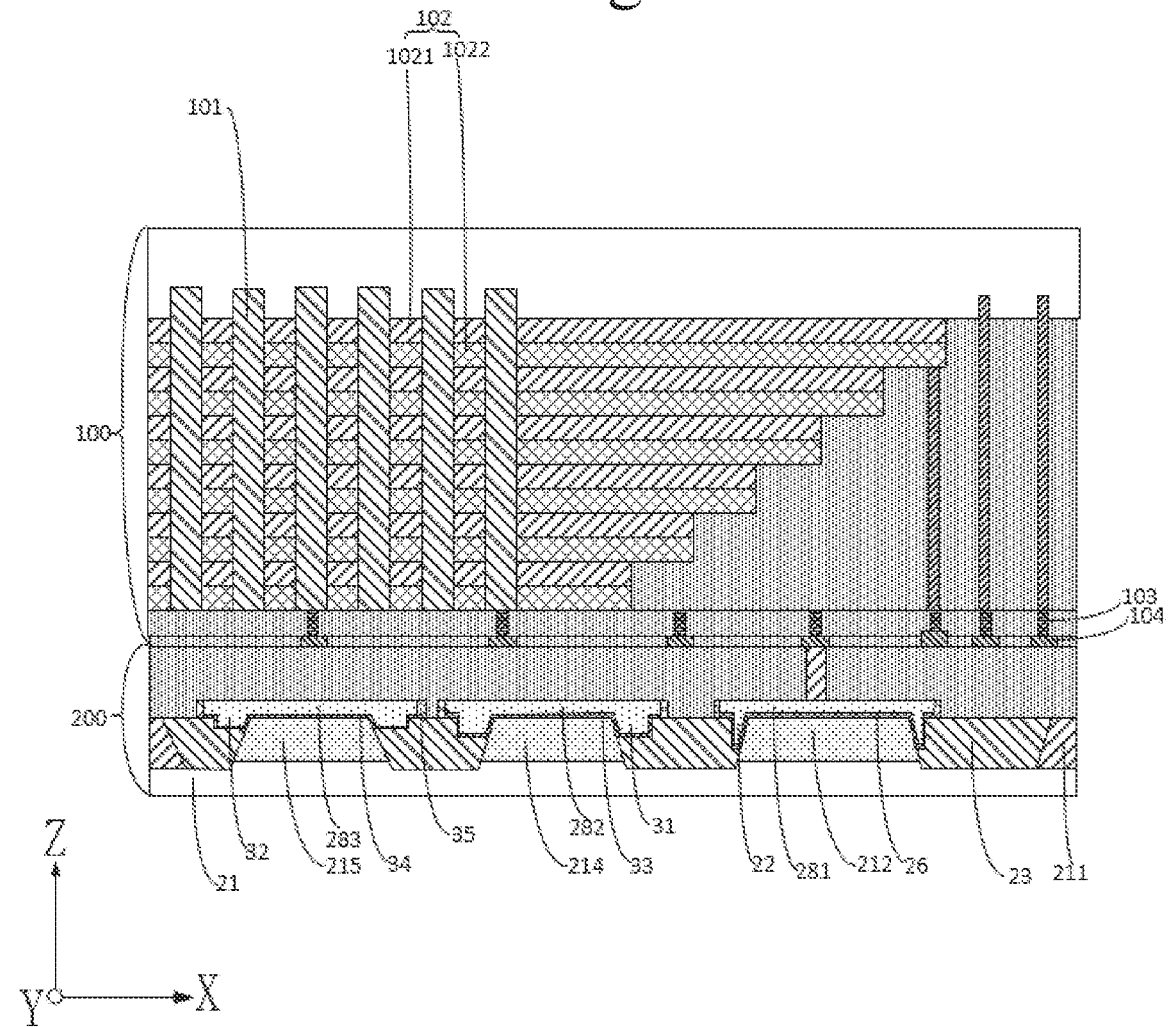
FIG. 36 is a schematic of cross-sectional structure of a NAND memory device provided by an embodiment of the present application.

Please refer to FIG. 36 which is a schematic of structure of a NAND memory device provided by an embodiment of the present application. As shown in FIG. 36, the NAND memory device may include a memory array 100 and a peripheral device 200 that are electrically connected, wherein the memory array 100 may include a plurality of memory cell strings 101, and the peripheral device 200 may include the semiconductor device in any of the above embodiments.

The above-mentioned peripheral device 200 may include: a substrate 21 which includes a first active region 212 and an isolation region 211 located around the first active region 212 which includes a first source region, a first channel region and a first drain region that are sequentially connected; a first groove 22 located between the isolation region 211 and the first channel region, the first groove 22 is partially located in the isolation region 211 and does not penetrate through the isolation region 211; a first gate insulating layer 26 covering the first groove 22 and the first channel region 2122; a first gate 281 located on the first gate insulating layer 26, the first gate 281 covers the first channel region 2122 and filling the first groove 22.

In one specific embodiment, the above-mentioned first groove 22 may be located between the isolation region 211 and the first active region 212 and surround the first active region 212.

In one specific embodiment, the above-mentioned substrate 21 may further include a second active region 214, the first active region 212 and the second active region 214 are spaced apart by the above-mentioned isolation region 211, and the second active region 214 includes a second source region, a second channel region and a second drain region that are sequentially connected.

The above-mentioned peripheral device 200 may further include: a second groove 31 located between the above-mentioned isolation region 211 and the above-mentioned second channel region, the second groove 31 is partially located in the above-mentioned isolation region 211 and does not penetrate through the isolation region 211. Further, the above-mentioned peripheral device 200 may further include a second gate insulating layer 33 covering the above-mentioned second groove 31 and the above-mentioned second channel region. Thereinto, the thickness of the second gate insulating layer 33 is different from the thickness of the first gate insulating layer 26, for example, the thickness of the second gate insulating layer 33 may be smaller than the thickness of the first gate insulating layer 26.

In one specific embodiment, the above-mentioned peripheral device 200 may further include a second gate 282, the second gate 282 covers the above-mentioned second channel region and fills the second groove 31 located between the above-mentioned isolation region 211 and the above-mentioned second channel region.

Thereinto, the depth of the second groove 31 in the longitudinal direction Z perpendicular to the substrate 21 is smaller than the depth of the first groove 22 in the longitudinal direction Z.

In some embodiments, the above-mentioned substrate 21 may further include a shallow trench disposed in the isolation region 211 and located around the first active region 212. The above-mentioned peripheral device 200 may further include a shallow trench isolation structure 23 located in the shallow trench. The above-mentioned first groove 22 may be located between the shallow trench isolation structure 23 and the first channel region, and the depth of the first groove 22 in the longitudinal direction Z perpendicular to the substrate 21 may be smaller than the depth of the shallow trench isolation structure 23 in the longitudinal direction Z.

In some embodiments, the above-mentioned peripheral device 200 may further include a sidewall 35 disposed on the side surface of the first gate 281.

It should be noted that, the various structures of the peripheral device 200 in this embodiment may refer to the specific implementation described in the above-mentioned semiconductor device embodiment, and thus will not be repeated here.

In the above-mentioned embodiment, the above-mentioned memory array 100 may further include: a stacked structure 102 located on the peripheral device 200, wherein each memory cell string 101 includes a channel layer and a storage functional layer penetrating through the stacked structure 102, and the storage functional layer is located between the channel layer and the stacked structure. Thereinto, the above-mentioned stacked structure 102 may include several gate layers 1021 and gate insulating layers 1022 stacked alternately in multiple layers in the longitudinal direction Z.

In some specific embodiments, the above-mentioned memory array 100 may further include an interconnection layer 104 disposed on the side of the stack structure 102 facing the peripheral device 200, wherein the memory cell string 101 is electrically connected to the interconnection layer 104, and the interconnection layer 104 may be electrically connected to the substrate 21 in the first source region, the substrate 21 in the first drain region and/or the first gate 281 of the above-mentioned peripheral device 200.

The above-mentioned memory array 100 may further include an interlayer dielectric layer disposed between the stack structure 102 and the interconnection layer 104, and a plurality of conductive contacts 103 formed in the interlayer dielectric layer. Thereinto, the plurality of conductive contacts 103 may include bit line contacts, and the bit line contacts may extend in the longitudinal direction Z, and one end is electrically connected with the memory cell string 101, and the other end is electrically connected with the interconnect layer 104.

It may be understood that the specific implementation of the memory array 100 in this embodiment may refer to the specific implementation of the memory array, and thus will not be repeated here.

Moreover, although the NAND memory device exemplified in this embodiment uses a wafer bonding architecture in which peripheral devices and a memory array are bonded as an example, in other embodiments, the above-mentioned NAND memory device may also be other possible NAND architectures, such as the peripheral under core array (PUC) architecture, the peripheral near core array (PNC) architecture, etc., and the embodiment of the present application are not specifically limited in this regard.

The NAND memory device provided by this embodiment improves the control of the gate to the transistor channel by increasing the effective length of the gate, thereby while reducing the transistor device size, being capable of improving electrical characteristic parameters of the transistor such as the saturation current, the leakage current and the like, improving the performance of the transistor device, and there is no need to etch the gate material layer to form the gate, avoiding the problem of the increase in the process difficulty of forming the gate by etching the gate material layer due to the reducing of the transistor device size, which in turn leads to the increase of production costs, and reducing production costs.

The foregoing embodiments are only some of the preferred embodiment of the present application, not intended to limit the present application, and any modifications, equivalent replacements and improvements made within the spirit and principle of the present application should be included in the scope of claimed by the present application.

What is claimed is:

1. A method for forming a semiconductor device, comprising:
    forming a substrate, wherein the substrate includes a first active region and an isolation region located around the first active region, and the first active region includes a first source region, a first channel region, and a first drain region that are sequentially connected, wherein forming the substrate comprises:
        forming a shallow trench in the isolation region and located around the first active region, and
        forming a shallow trench isolation structure in the shallow trench;
    forming a patterned first hard mask layer on the substrate, wherein the patterned first hard mask layer includes a first opening exposing the first channel region and a first part of the isolation region;
    forming a first groove between the isolation region and the first channel region through the first opening, wherein the first groove is partially located above the first part of the isolation region, wherein forming the first groove comprises:
        forming the first groove between the shallow trench isolation structure and the first channel region through the first opening, wherein a depth of the first groove in a longitudinal direction perpendicular to a top surface the substrate is smaller than a depth of the shallow trench isolation structure in the longitudinal direction, forming a patterned second hard mask layer on the patterned first hard mask layer to protect the shallow trench isolation structure, wherein the patterned second hard mask layer includes a second opening, the second opening is interconnected with the first opening; and selectively removing a part of the shallow trench isolation structure exposed by the first opening and the second opening to obtain the first groove between the shallow trench isolation structure and the first channel region;

forming a first gate insulating layer covering the first groove and the first channel region;

forming a first gate in the first opening and the first groove on the first gate insulating layer; and removing the patterned first hard mask layer.

2. The method of claim 1, wherein forming the first gate comprises:
depositing a gate material in the first opening and in the first groove on the first gate insulating layer; and
removing a portion of the gate material located outside the first opening by chemical mechanical polishing, wherein a remaining portion of the gate material forms the first gate that covers a top surface and a portion of sidewall of the first channel region.

3. The method of claim 1, wherein:
the substrate further includes a second active region, the first active region and the second active region are spaced apart by the isolation region, and the second active region includes a second source region, a second channel region and a second drain region that are sequentially connected; and
the patterned first hard mask layer further includes a third opening exposing the second channel region and a second part of the isolation region.

4. The method of claim 3, further comprising:
before forming the first gate, forming a second groove between the isolation region and the second channel region through the third opening, wherein the second groove is partially located in the isolation region without penetrating the isolation region; and
forming a second gate insulating layer covering the second groove and the second channel region, wherein a thickness of the second gate insulating layer is different from a thickness of the first gate insulating layer.

5. The method of claim 4, further comprising:
after forming the second gate insulating layer, forming a second gate in the third opening and the second groove on the second gate insulating layer.

6. The method of claim 4, wherein a depth of the second groove in a longitudinal direction perpendicular to a top surface of the substrate is smaller than a depth of the first groove in the longitudinal direction.

7. The method of claim 1, further comprising:
after the removing the patterned first hard mask layer, forming a sidewall on a side surface of the first gate.

8. A semiconductor device, comprising:
a substrate including a first active region and an isolation region located around the first active region, wherein the first active region includes a first source region, a first channel region, and a first drain region that are sequentially connected;

a first groove located between the isolation region and the first channel region, wherein the first groove is partially located above a first part of the isolation region;
a first gate insulating layer covering the first groove and the first channel region;
a first gate located on the first gate insulating layer, wherein the first gate covers the first channel region and fills the first groove;
a second active region in the substrate, wherein the first active region and the second active region are spaced apart by the isolation region, and the second active region includes a second source region, a second channel region, and a second drain region that are sequentially connected; and
a second groove located between the isolation region and the second channel region, wherein the second groove is partially located above a second part of the isolation region;
wherein a depth of the second groove in a longitudinal direction perpendicular to a top surface of the substrate is different than a depth of the first groove in the longitudinal direction.

9. The semiconductor device of claim 8, further comprising:
a second gate insulating layer covering the second groove and the second channel region, wherein a thickness of the second gate insulating layer is different from a thickness of the first gate insulating layer; and
a second gate covering the second channel region and filling the second groove.

10. The semiconductor device of claim 9, further comprising:
a third active region in the substrate, wherein the first active region, the second active region, and the third active region are spaced apart by the isolation region, and the third active region includes a third source region, a third channel region, and a third drain region that are sequentially connected;
a third groove located between the isolation region and the third channel region, wherein the third groove is partially located above a third part of the isolation region;
a third gate insulating layer covering the third groove and the third channel region, wherein a thickness of the third gate insulating layer is different from the thickness of the first gate insulating layer and the thickness of the second gate insulating layer; and
a third gate covering the third channel region and filling the third groove.

11. The semiconductor device of claim 10, wherein a depth of the third groove in a longitudinal direction perpendicular to a top surface of the substrate is different from the depth of the first groove and the depth of the second groove.

12. The semiconductor device of claim 8, further comprising:
a memory array including a plurality of memory cell strings;
wherein the first gate is electrically connected with the memory array.

13. The semiconductor device of claim 12, wherein the memory array further comprises:
a stacked structure, wherein each of the memory cell strings includes a channel layer and a storage functional layer penetrating through the stacked structure, and the storage functional layer is located between the channel layer and the stacked structure.

14. The semiconductor device of claim 13, wherein the memory array further comprises:
an interconnection layer disposed on the stacked structure, wherein the memory cell strings are electrically connected with the first gate through the interconnection layer.

15. A NAND memory device, comprising:
a memory array including a plurality of memory cell strings; and
a peripheral device electrically connected with the memory array, the peripheral device comprising:
a substrate including a first active region and an isolation region located around the first active region, wherein the first active region includes a first source region, a first channel region and a first drain region that are sequentially connected,
a first groove located between the isolation region and the first channel region, wherein the first groove is partially located above a first part of the isolation region,
a first gate insulating layer covering the first groove and the first channel region,
a first gate located on the first gate insulating layer, wherein the first gate covers the first channel region and fills the first groove,
a second active region in the substrate, wherein the first active region and the second active region are spaced apart by the isolation region, and the second active region includes a second source region, a second channel region and a second drain region that are sequentially connected, and
a second groove located between the isolation region and the second channel region, wherein the second groove is partially located above a second part of the isolation region,
wherein a depth of the second groove in a longitudinal direction perpendicular to a top surface of the substrate is smaller than a depth of the first groove in the longitudinal direction.

16. The NAND memory device of claim 15, wherein the peripheral device further comprises:
a second gate insulating layer covering the second groove and the second channel region, wherein a thickness of the second gate insulating layer is different from a thickness of the first gate insulating layer; and
a second gate covering the second channel region and filling the second groove.

17. The NAND memory device of claim 15, wherein the memory array further comprises:
a stacked structure located on the peripheral device, wherein each of the memory cell strings includes a channel layer and a storage functional layer penetrating through the stacked structure, and the storage functional layer is located between the channel layer and the stacked structure.

18. The NAND memory device of claim 17, wherein the memory array further comprises:
an interconnection layer disposed on a side of the stacked structure facing the peripheral device, wherein the memory cell strings are electrically connected with the peripheral device through the interconnection layer.

19. The NAND memory device of claim 17, wherein the peripheral device further comprises:
a third active region in the substrate, wherein the first active region, the second active region, and the third active region are spaced apart by the isolation region, and the third active region includes a third source region, a third channel region, and a third drain region that are sequentially connected;
a third groove located between the isolation region and the third channel region, wherein the third groove is partially located above a third part of the isolation region;
a third gate insulating layer covering the third groove and the third channel region, wherein a thickness of the third gate insulating layer is different from the thickness of the first gate insulating layer and the thickness of the second gate insulating layer; and
a third gate covering the third channel region and filling the third groove.

20. The NAND memory device of claim 19, wherein a depth of the third groove in a longitudinal direction perpendicular to a top surface of the substrate is different from the depth of the first groove and the depth of the second groove.

* * * * *